(12) United States Patent
Hush

(10) Patent No.: US 10,424,350 B2
(45) Date of Patent: Sep. 24, 2019

(54) PERFORMING LOGICAL OPERATIONS USING SENSING CIRCUITRY

(71) Applicant: Micron Technology, Inc., Boise, ID (US)

(72) Inventor: Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/651,186

(22) Filed: Jul. 17, 2017

(65) Prior Publication Data

US 2017/0316816 A1  Nov. 2, 2017

Related U.S. Application Data

(62) Division of application No. 14/717,491, filed on May 20, 2015, now Pat. No. 9,711,206.

(Continued)

(51) Int. Cl.
*G11C 7/10* (2006.01)
*G11C 11/4091* (2006.01)
(Continued)

(52) U.S. Cl.
CPC ............ *G11C 7/1012* (2013.01); *G11C 7/065* (2013.01); *G11C 7/1006* (2013.01); *G11C 11/4091* (2013.01); *G11C 11/4093* (2013.01)

(58) Field of Classification Search
CPC ........... G11C 8/10; G11C 7/06; G11C 11/419; G11C 7/1006; G11C 8/12; G06F 12/0246; G06F 12/0646; G06F 13/40; G06F 9/30
See application file for complete search history.

(56) References Cited

U.S. PATENT DOCUMENTS 4,380,046 A   4/1983 Fung
4,435,792 A   3/1984 Bechtolsheim
(Continued)

FOREIGN PATENT DOCUMENTS

CN   102141905   8/2011
EP   0214718    3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Vanthu T Nguyen
(74) *Attorney, Agent, or Firm* — Brooks, Cameron & Huebsch, PLLC

(57) ABSTRACT

The present disclosure includes apparatuses and methods related to performing logical operations using sensing circuitry. An example apparatus comprises an array of memory cells and sensing circuitry coupled to the array of memory cells. The sensing circuitry includes a primary latch and a secondary latch. The primary latch is coupled to a pair of complementary sense lines and selectively coupled to a pair of adjacent complementary sense lines. The secondary latch is selectively coupled to the primary latch. The primary latch and secondary latch are configured to shift a data value between the pair of adjacent complementary sense lines and the primary latch. The primary latch and secondary latch are configured to shift the data value from the pair of adjacent complementary sense lines without activating a row line.

19 Claims, 14 Drawing Sheets

Related U.S. Application Data

(60) Provisional application No. 62/008,257, filed on Jun. 5, 2014.

(51) Int. Cl.
  *G11C 11/4093* (2006.01)
  *G11C 7/06* (2006.01)

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffman et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,091,625 A | 7/2000 | Braun | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,012,831 B2 * | 3/2006 | Shigenami | G11C 11/406 365/149 |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,463,501 B2 | 12/2008 | Dosaka | |
| 7,483,290 B2 | 1/2009 | Kikuchi | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,603,605 B2 | 10/2009 | Mittal | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,894,240 B2 | 2/2011 | Beck | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,130,582 B2 | 3/2012 | Shimano | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Sec | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,332,580 B2 * | 12/2012 | Akerib | G06F 9/3879 365/189.2 |
| 8,339,824 B2 | 12/2012 | Cooke | |
| 8,339,883 B2 | 12/2012 | Yu et al. | |

(56) References Cited

U.S. PATENT DOCUMENTS

| | | |
|---|---|---|
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0101231 A1 | 5/2006 | Higashida |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Sec |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |
| 2015/0356006 A1 | 12/2015 | Perner |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

(56) References Cited

OTHER PUBLICATIONS

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Office Action for related Taiwan Patent Application No. 104118421, dated Aug. 22, 2016, 26 pages.

International Search Report and Written Opinion from related international application No. PCT/US2015/033513 dated Aug. 25, 2015, 14 pp.

\* cited by examiner

PERFORMING LOGICAL OPERATIONS USING SENSING CIRCUITRY

PRIORITY INFORMATION

This application is a Divisional of U.S. application Ser. No. 14/717,491, filed May 20, 2015, which issues as U.S. Pat. No. 9,711,206 on Jul. 18, 2017, which claims the benefit of U.S. Provisional Application No. 62/008,257, filed Jun. 5, 2014, the contents of which are incorporated herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing. However, such PIM devices may have various drawbacks such as an increased chip size. Moreover, such PIM devices may still consume undesirable amounts of power in association with performing logical operations (e.g., compute functions).

DETAILED DESCRIPTION

Figure 1:
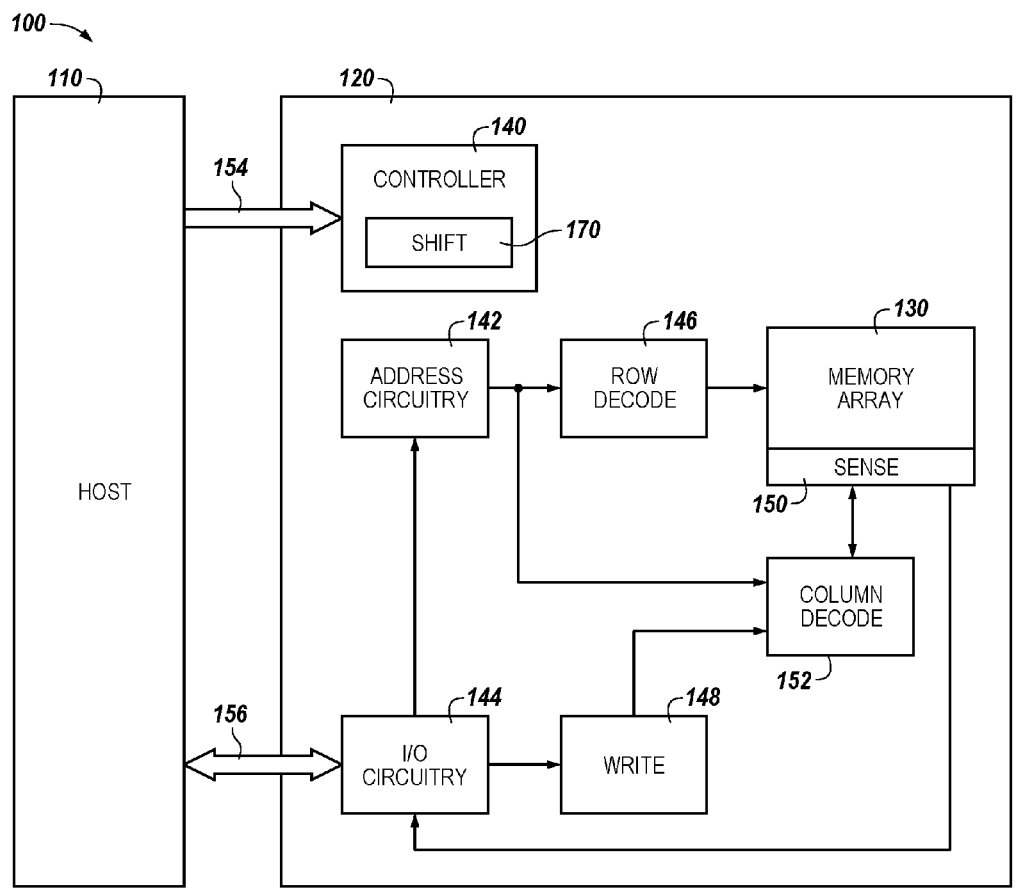
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry coupled to the array of memory cells. The sensing circuitry includes a primary latch and a secondary latch. The primary latch is coupled to a pair of complementary sense lines and selectively coupled to a pair of adjacent complementary sense lines. The secondary latch is selectively coupled to the primary latch. The primary latch and secondary latch are configured to shift a data value between the pair of adjacent complementary sense lines and the primary latch. The primary latch and secondary latch are configured to shift the data value from the pair of adjacent complementary sense lines without enabling a row line.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 306 may reference element "06" in FIG. 3, and a similar element may be referenced as 706 in FIG. 7. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

The controller 140 can include a shift controller 170 that can control signals provided to, for instance, shift circuitry in association with performing data shifting as described further herein. For example, the shift controller 170 can control shifting data (e.g., right or left) in an array.

Examples of the sensing circuitry 150 are described further below. For instance, in a number of embodiments, the sensing circuitry 150 can comprise a number of sense amplifiers (e.g., sense amplifier 306 shown in FIG. 3 or sense amplifier 806 shown in FIG. 8) and a number of compute components (e.g., compute component 331 shown in FIG. 3), which may comprise an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on control circuitry 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
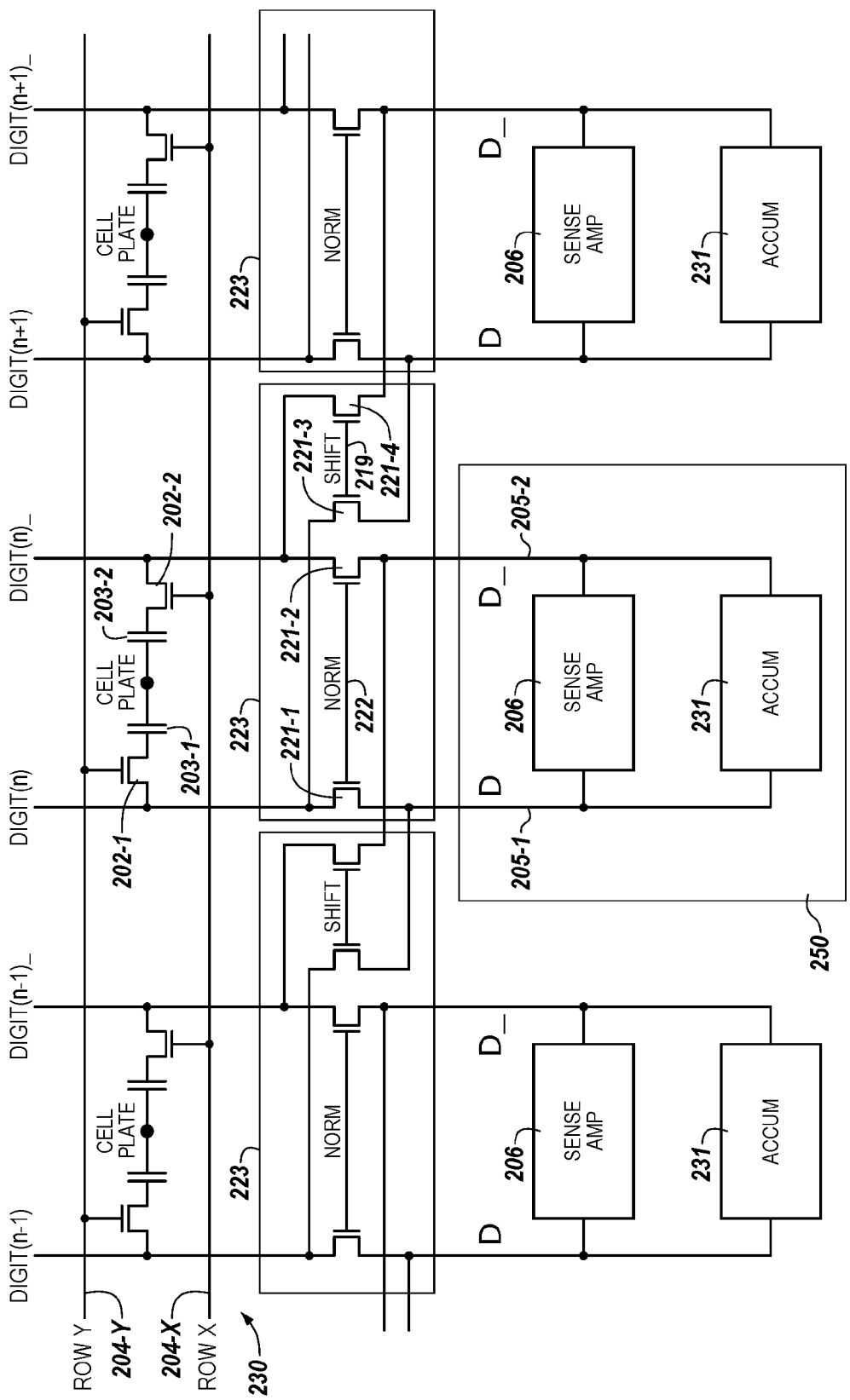
FIG. 2 is a schematic diagram illustrating a portion of a memory array coupled to sensing circuitry in accordance with a number of embodiments of the present disclosure.

FIG. 2 is a schematic diagram illustrating a portion of a memory array 230 coupled to sensing circuitry 250 in accordance with a number of embodiments of the present disclosure. In this example, the memory array 230 can be a DRAM array of 1T1C (one transistor one capacitor) memory cells each comprised of an access device 202-1, 202-2 (e.g., transistor) and a storage element 203-1, 203-2 (e.g., a capacitor).

In a number of embodiments, the memory cells may be destructive read memory cells (e.g., reading the data stored in the cell destroys the data such that the data originally stored in the cell is refreshed after being read). The cells of the memory array 3230 are arranged in rows coupled by word lines (e.g., 204-X (Row X) and 204-Y (Row Y)) and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2, embodiments of the present disclosure are not so limited, and an array of memory cells can include additional columns of memory cells and/or data lines (e.g., 4,096, 8,192, 16,384, etc.).

As shown in FIG. 2, a gate of memory cell transistor 202-1 can be coupled to word line 204-Y and a gate of memory cell transistor 202-2 can be coupled to word line 204-X. A first source/drain region of memory cell transistor 202-1 can be coupled to its corresponding data line 205-1 (D) and a first source/drain region of memory cell transistor 202-2 can be coupled to its corresponding data line 205-2 (D_). A second source/drain region of memory cell transistor 202-1 can be coupled to corresponding storage element 203-1, and a second source/drain region of memory cell transistor 202-2 can be coupled to corresponding storage element 203-2.

The memory array 230 is coupled to sensing circuitry 250 in accordance with a number of embodiments of the present disclosure. For example, the sensing circuitry can be coupled the array of memory cells by one or more data lines (e.g., complementary data lines D and D_) through shift circuitry 223. As such, the sensing circuitry can be configured and/or operated to sense the data value from a memory cell coupled to the data line, accumulate the data value from the latch to the secondary latch without performing a data line address access, and invert the data value in the latch after the data value is accumulated in the secondary latch. The shift circuitry 223 can be configured to connect the sensing circuitry to a second array such that at most one of the array and a second array are coupled to the sensing circuitry at once. The shift circuitry 223 can also be configured such that the array and the second array can both be simultaneously disconnected from the sensing circuitry.

The sensing circuitry 250, including the sense amplifier 206 and the compute circuit 231, can be coupled to the array 230 via the shift circuitry 223. The shift circuitry 223 can include a pair of isolation transistors 221-1 and 221-2 having gates coupled to a first control signal 222 (e.g., NORM) that, when activated, enables (e.g., turns on) the isolation transistors 221-1 and 221-2 to connect the sensing circuitry 250 (e.g., sense amplifier 206 and the compute circuit 231) to a column of memory cells with which the sensing circuitry 250 is associated. According to various embodiments, conduction of isolation transistors 221-1 and 221-2 can be referred to as a "normal" configuration.

As illustrated in FIG. 2, the shift circuitry 223 can also include another pair of isolation transistors 221-3 and 221-4 having gates coupled to a second control signal 219 (e.g., SHIFT), which may be activated when NORM is deactivated, for example. The isolation transistors 221-3 and 221-4 can be arranged such that the sensing circuitry 250 is coupled to a different set of complementary data lines than the complementary data lines to which isolation transistors 221-1 and 221-2 connect sense amplifier 206 and compute circuit 231. For example, enabling isolation transistors 221-3 and 221-4 can connect the sensing circuitry 250 to an adjacent pair of complementary data lines (e.g., to the right), as shown in FIG. 2.

Although shift circuitry 223 is shown in FIG. 2 having isolation transistors 221-1 and 221-2 coupled to one set of complementary data lines (e.g., DIGIT(n) and DIGIT(n)_ and isolation transistors 221-3 and 221-4 arranged so as to be coupled to adjacent data lines in one particular direction (e.g., data lines DIGIT(n+1) and DIGIT(n+1)_ shown to the right in FIG. 2), embodiments of the present disclosure are not so limited, and shift circuitry can include, for example, isolation transistors 221-1 and 221-2 coupled to one set of complementary data lines (e.g., DIGIT(n) and DIGIT(n)_ and isolation transistors 221-3 and 221-4 arranged so as to be coupled to adjacent data lines in another particular direction (e.g., data lines DIGIT(n−1) and DIGIT(n−1)_ shown to the left in FIG. 2). In various embodiments, can include all isolation transistors in a single shift circuitry 223, or other configurations of isolation transistors 221-1, 221-2, 221-3, and/or 221-4 in shift circuitry 223.

According to some embodiments, shift circuitry 223 can be configured to connect the sensing circuitry 250 to a non-adjacent pair of complementary data lines. According to various embodiments, shift circuitry 223 can be configured to connect the sensing circuitry 250 to a pair of complementary data lines from among a plurality of pairs of complementary data lines (e.g., selected from among adjacent pairs of complementary data lines to the left and right of the pair of complementary data lines to which isolation transistors 221-1 and 221-2 are coupled).

Figure 3:
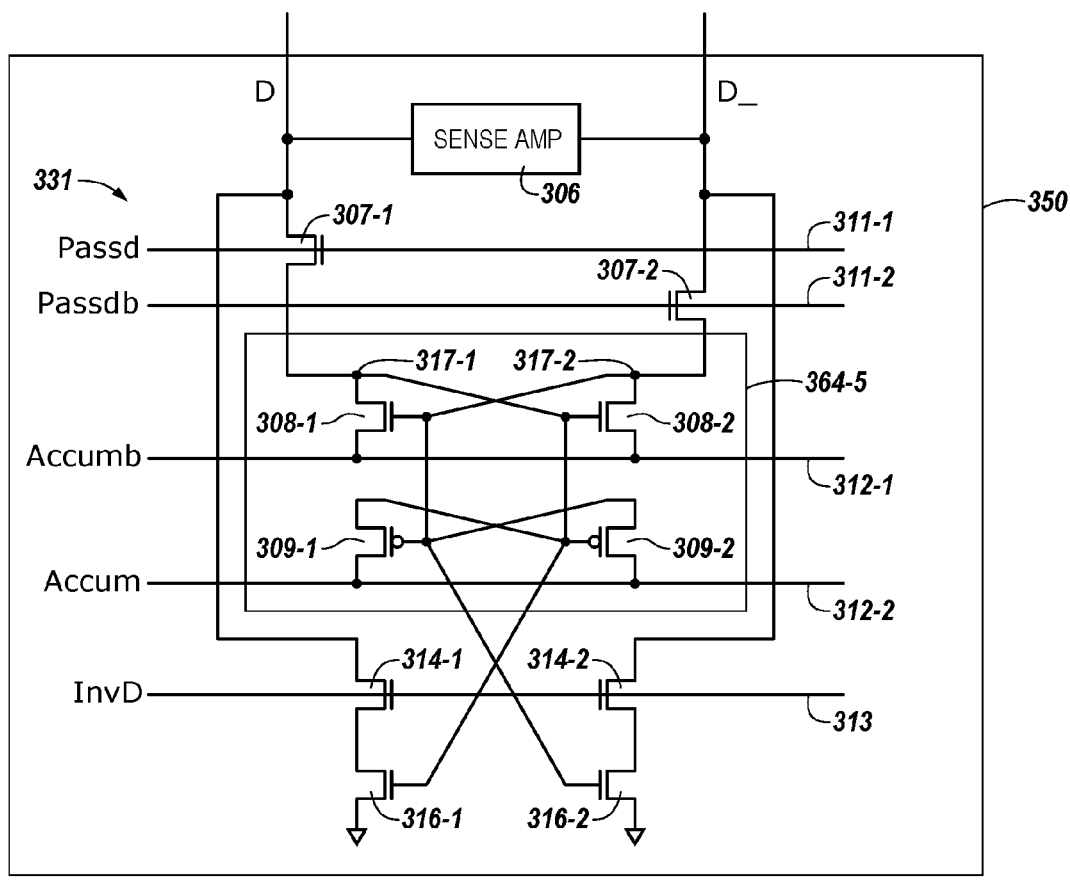
FIG. 3 is a schematic diagram illustrating sensing circuitry in accordance with a number of embodiments of the present disclosure.

FIG. 3 is a schematic diagram illustrating sensing circuitry 350 in accordance with a number of embodiments of the present disclosure. In this example, the sensing circuitry 350 comprises a sense amplifier 306 and a compute component 331 corresponding to respective columns of memory cells (e.g., coupled to respective pairs of complementary data lines). The sensing circuitry 350 can correspond to sensing circuitry 150 shown in FIG. 1, for example. The sense amplifier 306 can be a sense amplifier such as sense amplifier 806 described below in association with FIG. 8. The sense amplifier 306 can be operated to determine a data value (e.g., logic state) stored in a selected memory cell. The sense amplifier 306 can comprise a cross coupled latch, which can be referred to herein as a primary latch. Embodiments are not limited to the example sense amplifier 306. As an example, the sense amplifier 306 can be current-mode sense amplifier and/or single-ended sense amplifier (e.g., sense amplifier coupled to one data line). Also, embodiments of the present disclosure are not limited to a folded data line architecture.

According to various embodiments, the compute component 331 can comprise a latch, which can be referred to herein as a secondary latch, and which can serve as, and be referred to as, an accumulator. The secondary latch can be a static latch, such as a cross coupled latch, and/or a dynamic latch.

As described further below, in a number of embodiments, the sensing circuitry (e.g., sense amplifier 306 and compute component 331) can be operated to perform a logical operation using the latch of the compute component 331 and store the result in the compute component 350 and/or sense amplifier 306 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

Although shown in FIG. 1 but not shown in FIG. 3, each column of memory cells can be coupled to a column decode line that can be enabled to transfer, via local I/O line 301, a data value from a corresponding sense amplifier 306 and/or compute component 331 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines (e.g., I/O line 301) to perform logical operations in accordance with embodiments of the present disclosure. In a number of embodiments, shift circuitry such as that shown in FIG. 3 can be operated (e.g., in conjunction with sense amplifiers 306 and compute components 331) in performing compute functions such as adding and subtracting functions without transferring data to a control component external to the array, for instance.

In the example illustrated in FIG. 3, the compute component 331 includes eight transistors (e.g., four transistors per complementary data line). The transistors are formed on pitch with the sense amplifier 306 and with the memory cells of the array 330. The compute component 331 comprises a secondary latch 364-S, which can operate as (e.g., serve as) an accumulator in performing logical operations. As such, the secondary latch 364-S of the compute component 331 may be referred to as the accumulator of the compute component 331. The compute component 331 is coupled to the sense amplifier 306 via the data lines 305-1 (D) and D_205-2 as shown in FIG. 3. In this example, the transistors of compute component 331 are n-channel transistors (e.g., NMOS transistors) and p-channel transistors (e.g., PMOS transistors); however, embodiments are not so limited.

In the example illustrated in FIG. 3, the circuitry corresponding to compute circuit 331 comprises five transistors coupled to each of the data lines 305-1 (D) and 305-2 (D_). However, embodiments are not limited to this example. Transistors 307-1 and 307-2 have a first source/drain region coupled to data lines 305-1 (D) and 305-2 (D_) respectively, and a second source/drain region coupled to a cross coupled latch (e.g., coupled to gates of a pair of cross coupled transistors, such as cross coupled NMOS transistors 308-1 and 308-2 and cross coupled PMOS transistors 309-1 and 309-2). As described further herein, the cross coupled latch comprising transistors 308-1, 308-2, 309-1, and 309-2 can be referred to as a secondary latch 364-S.

The transistors 307-1 and 307-2 can be referred to as pass transistors, which can be enabled via respective signals 311-1 (Passd) and 311-2 (Passdb) (i.e., "Passd bar") in order to pass the voltages or currents on the respective data lines 305-1 (D) and 305-2 (D_) to the inputs of the cross coupled latch comprising transistors 308-1, 308-2, 309-1, and 309-2 (e.g., the input of the secondary latch 364-S). In this example, the second source/drain region of transistor 307-1 is directly coupled to a first source/drain region of transistors 308-1 and 309-1 as well as to the gates of transistors 308-2 and 309-2. Similarly, the second source/drain region of transistor 307-2 is directly coupled to a first source/drain region of transistors 308-2 and 309-2 as well as to the gates of transistors 308-1 and 309-1.

A second source/drain region of transistor 308-1 and 308-2 is commonly directly coupled to a negative control signal 312-1 (Accumb) (i.e., "Accum bar"). A second source/drain region of transistors 309-1 and 309-2 is commonly directly coupled to a positive control signal 312-2 (Accum). The Accum signal 312-2 can be a supply voltage (e.g., $V_{DD}$) and the Accumb signal can be a reference voltage (e.g., ground). Activating signals 312-1 and 312-2 enables the cross coupled latch comprising transistors 308-1, 308-2, 309-1, and 309-2 corresponding to the secondary latch 364-S.

The enabled sense amplifier pair operates to amplify a differential voltage between common node 317-1 and common node 317-2 such that node 317-1 is driven to one of the Accum signal voltage and the Accumb signal voltage (e.g., to one of $V_{DD}$ and ground), and node 317-2 is driven to the other of the Accum signal voltage and the Accumb signal voltage. As described further below, the signals 312-1 and 312-2 are labeled "Accum" and "Accumb" because the secondary latch can serve as an accumulator while being used to perform a logical operation. As described further herein, in a number of embodiments, a compute circuit comprising an accumulator coupled to a sense amplifier can be configured to perform a logical operation that comprises performing an accumulate operation on a data value represented by a signal (e.g., voltage or current) on at least one of a pair of complementary data lines.

The compute circuit 331 also includes inverting transistors 314-1 and 314-2 having a first source/drain region directly coupled to the respective data lines 305-1 (D) and 305-2 (D_). A second source/drain region of the transistors 314-1 and 314-2 is directly coupled to a first source/drain region of pull-down transistors 316-1 and 316-2, respectively. The gates of transistors 314-1 and 314-2 are coupled to a signal 313 (InvD). The gate of transistor 316-1 is coupled to the common node 317-1 to which the gate of transistor 308-2, the gate of transistor 309-2, and the first source/drain region of transistor 308-1 are also directly coupled. In a complementary fashion, the gate of transistor 316-2 is directly coupled to the common node 317-2 to which the gate of transistor 308-1, the gate of transistor 309-1, and the first source/drain region of transistor 308-2 are also directly coupled. As such, activating signal InvD serves to invert the data value stored in the secondary latch and drives the inverted value onto data lines 305-1 (D) and 305-2 (D_).

The compute circuit 331 shown in FIG. 3 can be operated (e.g., via the Passd, Passdb, Accumb, Accum, and InvD signals) to perform various logical operations including AND, NAND, OR, NOR, and invert operations, among others. The logical operations can be R-input logical operations, with "R" representing a value of two or more.

For instance, an R-input logical operation can be performed using data stored in array 330 as inputs, and the result can be stored to a suitable location (e.g., back to array 330 and/or to a different location) via operation of the sensing circuitry and/or for further operations in the accumulator. In the examples described below, an R-input logical operation includes using a data value (e.g., logic "1" or logic "0") stored in a memory cell coupled to a first particular word line (e.g., 204-X, 204-Y) and to a particular data line (e.g., 305-1 (D)) as a first input and data values stored in memory cells coupled to a number of additional word lines (e.g., 204-X, 204-Y), and commonly coupled to the particular data line (e.g., 305-1 (D)), as a respective number of additional inputs.

In this manner, a number of logical operations can be performed in parallel. For instance, 4K logical operations could be performed in parallel on an array having 4K data lines. In this example, 4K cells coupled to a first word line could serve as 4K first inputs, 4K cells coupled to a second word line could serve as 4K second inputs, and 4K cells coupled to a third word line could serve as 4K third inputs in a 3-input logical operation. As such, in this example, 4K separate 3-input logical operations can be performed in parallel.

In a number of embodiments, a first operation phase of an R-input logical operation includes performing a sensing operation on a memory cell coupled to a particular word line (e.g., 204-X, 204-Y) and to a particular data line (e.g., 305-1) to determine its stored data value (e.g., logic "1" or logic "0"), which serves as a first input in an R-input logical operation. The first input (e.g., the sensed stored data value) can then be transferred (e.g., copied) to a latch associated with compute circuit 331. A number of intermediate operation phases can be performed and can also include performing sensing operations on memory cells coupled to a respective number of additional word lines (e.g., 204-X, 204-Y) and to the particular data line (e.g., 305-1) to determine their stored data values, which serve as a respective number of additional inputs (e.g., R−1 additional inputs) to the R-input logical operation.

A last operation phase of an R-input logical operation involves operating the sensing circuitry to store the result of the logical operation to a suitable location. As an example, the result can be stored back to the array (e.g., back to a memory cell coupled to the particular data line 305-1). Storing the result back to the array can occur without enabling a column decode line. The result can also be stored to a location other than in array 330. For instance, the result can be stored (e.g., via local I/O lines coupled to sense amplifier 306) to an external register associated with a processing resource such as a host processor; however, embodiments are not so limited. Details regarding the first, intermediate, and last operation phases are described further below in association with FIG. 5.

Figure 4:
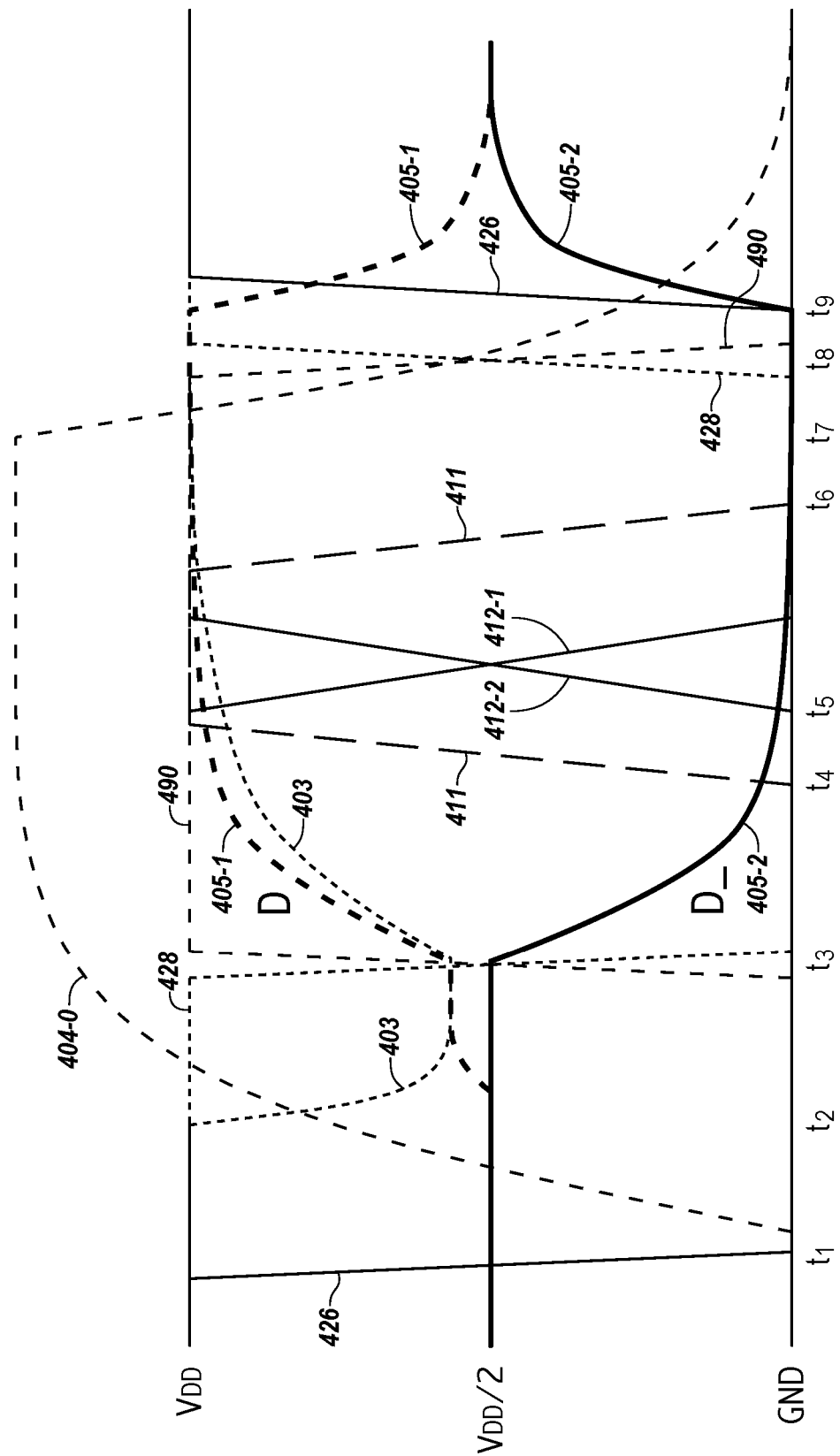
FIG. 4 illustrates a timing diagram associated with performing a number of logical operations using sensing circuitry in accordance with a number of embodiments of the present disclosure.

FIG. 4 illustrates a timing diagram associated with performing a number of logical operations using sensing circuitry in accordance with a number of embodiments of the present disclosure. The timing diagram shown in FIG. 4 illustrates signals (e.g., voltage signals) associated with performing a first operation phase of a logical operation (e.g., an R-input logical operation). The first operation phase described with respect to FIG. 4 can be a first operation phase of an AND, NAND, OR, or NOR operation, for instance. Performing the operation phase illustrated in FIG. 4 can involve consuming significantly less energy (e.g., about half) than previous processing approaches that may involve providing a full swing between voltage rails (e.g., between a supply and ground).

In the example illustrated in FIG. 4, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 4 do not necessarily represent a same absolute or relative time as similar time references in other timing diagrams. At time $t_1$, the equilibration signal 426 is deactivated, and then a selected row is enabled (e.g., the row corresponding to a memory cell whose data value is to be sensed and used as a first input). Signal 404-0 represents the voltage signal applied to the selected row (e.g., row 204-X, 204-Y shown in FIG. 2). When row signal 204-X, 204-Y reaches the threshold voltage (Vt) of the access transistor (e.g., 202-1, 202-2) corresponding to the selected cell, the access transistor turns on and couples the data line D to the selected memory cell (e.g., to the capacitor 203-1, 203-2 if the cell is a 1T1C DRAM cell), which creates a differential voltage signal between the data lines 305-1 (D) and 305-2 (D_) (e.g., as indicated by signals 405-1 and 405-2 on the data lines, respectively) between times $t_2$ and $t_3$. The voltage of the selected cell is represented by signal 403. Due to conservation of energy, creating the differential signal between data lines 305-1 (D) and 305-2 (D_) (e.g., by coupling the cell to data line D) does not consume energy, since the energy associated with activating/deactivating the row signal 204-X, 204-Y can be amortized over the plurality of memory cells coupled to the row.

At time $t_3$, the sense amplifier (e.g., 306 shown in FIG. 3) is enabled (e.g., a positive control signal PSA 490 goes high and the negative control signal RNL_ 428 goes low), which amplifies the differential signal between data lines 305-1 (D) and 305-2 (D_), resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 306. The primary energy consumption occurs in charging the data line 305-1 (D) from the equilibration voltage $V_{DD}/2$ to the rail voltage $V_{DD}$.

According to some embodiments, the primary latch of sense amplifier 306 can be coupled to the complementary data lines D and D_ through respective pass transistors (e.g., a second set of pass transistors or the sense amplifier 306 is coupled to the complementary data lines D and D_ on the same side of the pass transistors 307-1 and 307-2 that the compute component 331). The pass transistor through which one node (e.g., S1) of the primary latch of sense amplifier 306 is coupled to the data line D can be controlled by a PASSD control signal 411 and the pass transistor through which another node (e.g., S2) of the primary latch of sense amplifier 306 is coupled to the data line D_ can be controlled by a PASSDB control signal, which can behave here the same as the PASSD control signal.

At time $t_4$, the pass transistors can be enabled (e.g., via respective PASSD and PASSDB control signals applied to control lines coupled to the respective gates of the pass transistors. At time $t_5$, the accumulator control signals Accumb and Accum are activated via respective control lines 312-1 and 312-2. As described below, the accumulator control signals 412-1 and 412-2 may remain activated for subsequent operation phases. As such, in this example, activating the Accumb and Accum control signals 412-1 and 412-2 enables the secondary latch (e.g., accumulator) of compute component 331. The sensed data value stored in sense amplifier 306 is transferred (e.g., copied) to the secondary latch 364-S.

At time $t_6$, the pass transistors 307-1 and 307-2 are disabled (e.g., turned off) by the PASSD and PASSDB control signals 411 going low. However, since the accumulator control signals 412-1 and 412-2 remain activated, an accumulated result is stored (e.g., latched) in the secondary latch (e.g., accumulator). At time $t_7$, the row signal 404-0 is deactivated, and the array sense amplifiers are disabled at time $t_8$ (e.g., sense amplifier control signals 428 and 490 are deactivated).

At time $t_9$, the data lines D and D_ are equilibrated (e.g., equilibration signal 426 is activated), as illustrated by data line voltage signals 405-1 and 405-2 moving from their respective rail values to the equilibration voltage ($V_{DD}/2$). The equilibration consumes little energy due to the law of conservation of energy. As described below in association with FIG. 8, equilibration can involve shorting the complementary data lines D and D_ together at an equilibration voltage, which is $V_{DD}/2$, in this example. Equilibration can occur, for instance, prior to a memory cell sensing operation.

Figure 5:
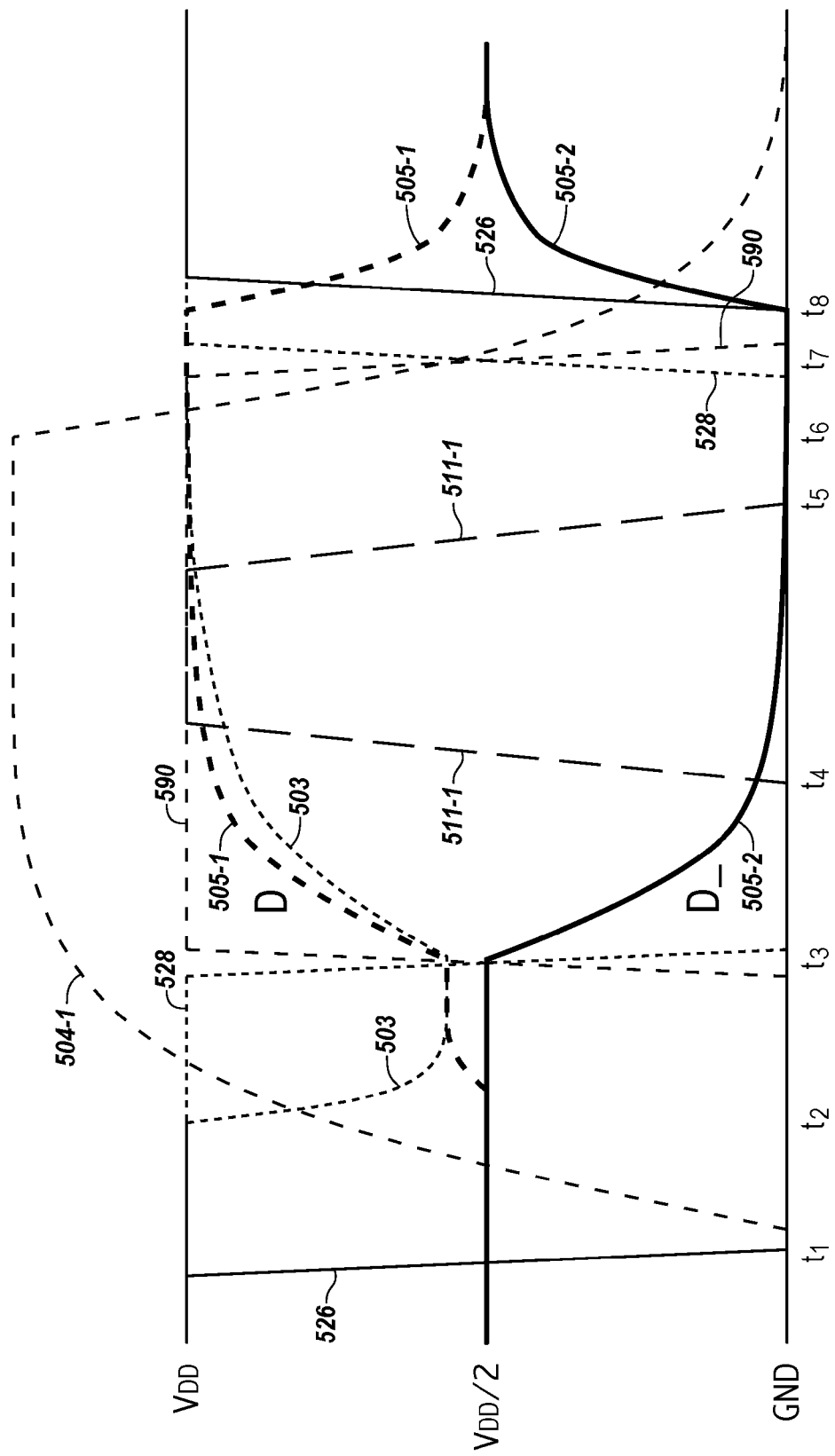
FIG. 5 illustrates a timing diagram associated with performing a number of logical operations using sensing circuitry in accordance with a number of embodiments of the present disclosure.
Figure 6:
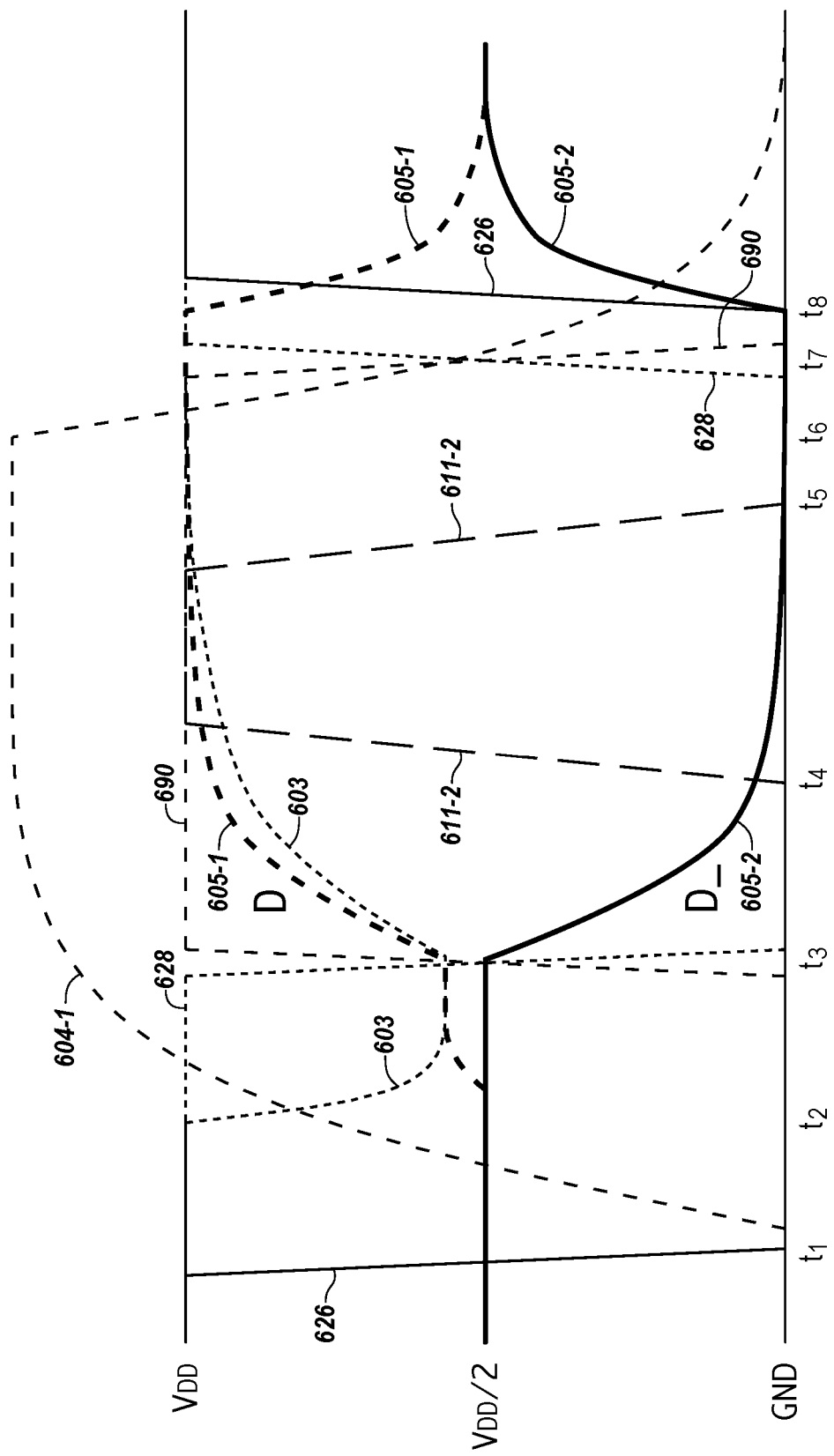
FIG. 6 illustrates a timing diagram associated with performing a number of logical operations using sensing circuitry in accordance with a number of embodiments of the present disclosure.

FIGS. 5 and 6 respectively illustrate timing diagrams associated with performing a number of logical operations using sensing circuitry in accordance with a number of embodiments of the present disclosure. Timing diagrams shown in FIGS. 5 and 6 illustrate signals (e.g., voltage signals) associated with performing a number of intermediate operation phases of a logical operation (e.g., an R-input logical operation). For instance, timing diagram shown in FIG. 5 corresponds to a number of intermediate operation phases of an R-input NAND operation or an R-input AND operation, and timing diagram shown in FIG. 6 corresponds to a number of intermediate operation phases of an R-input NOR operation or an R-input OR operation. For example, performing an AND or NAND operation can include performing the operation phase shown in FIG. 5 one or more times subsequent to an initial operation phase such as that described with respect to FIG. 4. Similarly, performing an OR or NOR operation can include performing the operation phase shown and described with respect to FIG. 6 one or more times subsequent to an initial operation phase such as that described with respect to FIG. 4.

As shown in the timing diagrams illustrated in FIGS. 5 and 6, at time $t_1$, equilibration is disabled (e.g., the equilibration signal 526/626 is deactivated), and then a selected row is enabled (e.g., the row corresponding to a memory cell whose data value is to be sensed and used as an input such as a second input, third input, etc.). Signal 504-1/604-1 represents the voltage signal applied to the selected row (e.g., 204-X (Row X), 204-Y (Row Y) shown in FIG. 2). When row signal 504-1/604-1 reaches the threshold voltage (Vt) of the access transistor (e.g., 302 shown in FIG. 3) corresponding to the selected cell, the access transistor turns on and couples the data line D to the selected memory cell (e.g., to the capacitor 303 if the cell is a 1T1C DRAM cell), which creates a differential voltage signal between the data lines D and D_ (e.g., as indicated by signals 505-1/605-1 and 505-2/605-2, respectively) between times $t_2$ and $t_3$. The voltage of the selected cell is represented by signal 503/603. Due to conservation of energy, creating the differential signal between D and D_ (e.g., by coupling the cell to data line D) does not consume energy, since the energy associated with activating/deactivating the row signal 504-1/604-1 can be amortized over the plurality of memory cells coupled to the row.

At time $t_3$, the sense amplifier (e.g., 306 shown in FIG. 3) is enabled (e.g., a positive control signal 590/690 (e.g., corresponding to PSA 890 shown in FIG. 8) goes high, and the negative control signal 528/628 (e.g., RNL_ 828 shown in FIG. 8) goes low), which amplifies the differential signal between D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 306. The primary energy consumption occurs in charging the data line D (1305-1) from the equilibration voltage $V_{DD}/2$ to the rail voltage $V_{DD}$.

As shown in timing diagrams illustrated in FIGS. 5 and 6, at time $t_4$ (e.g., after the selected cell is sensed), only one of control signals 511-1 (PASSD) shown in FIGS. 5 and 611-2 (PASSDB) shown in FIG. 6 is activated (e.g., only one of pass transistors (if present) is enabled), depending on the particular logic operation. For example, since the timing diagram illustrated in FIG. 5 corresponds to an intermediate phase of a NAND or AND operation, control signal 511-1 (PASSD) is activated at time t4 to turn on the pass transistor coupling the primary latch to data line D and the PASSDB control signal remains deactivated leaving the pass transistor coupling the primary latch to data line D_ turned off. Conversely, since the timing diagram illustrated in FIG. 6 corresponds to an intermediate phase of a NOR or OR operation, control signal 611-2 (PASSDB) is activated at time t4 to turn on the pass transistor coupling the primary latch to data line D_ and control signal PASSD remains deactivated leaving the pass transistor coupling the primary latch to data line D turned off. Recall from above that the accumulator control signals 412-1 (Accumb) and 412-2 (Accum) were activated during the initial operation phase described with respect to FIG. 4, and they remain activated during the intermediate operation phase(s).

Since the accumulator was previously enabled, activating only PASSD (511-1 as shown in FIG. 5) results in accumulating the data value corresponding to the voltage signal 505-1 shown in FIG. 5 corresponding to data line D. Similarly, activating only PASSDB (611-2 as shown in FIG. 6) results in accumulating the data value corresponding to the voltage signal 605-2 corresponding to data line D_. For instance, in an example AND/NAND operation shown in the timing diagram illustrated in FIG. 5 in which only PASSD (511-1) is activated, if the data value stored in the second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 6 in which only PASSDB 611-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 605-2 on D_ is setting the true data value of the accumulator.

At the conclusion of an intermediate operation phase such as that shown in FIG. 5 or 6, the PASSD signal 511-1 (e.g., for AND/NAND) or the PASSDB signal 611-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 5 or 6 can be repeated in order to accumulate results from a number of additional rows. As an example, the sequence of timing diagram illustrated in FIGS. 5 and/or 6 can be performed a subsequent (e.g., second) time for a third memory cell, a subsequent (e.g., third) time for a fourth memory cell, etc. For instance, for a 10-input NOR operation, the intermediate phase shown in FIG. 6 can occur 9 times to provide 9 inputs of the 10-input logical operation, with the tenth input being determined during the initial operation phase (e.g., as described with respect to FIG. 4).

Figure 8:
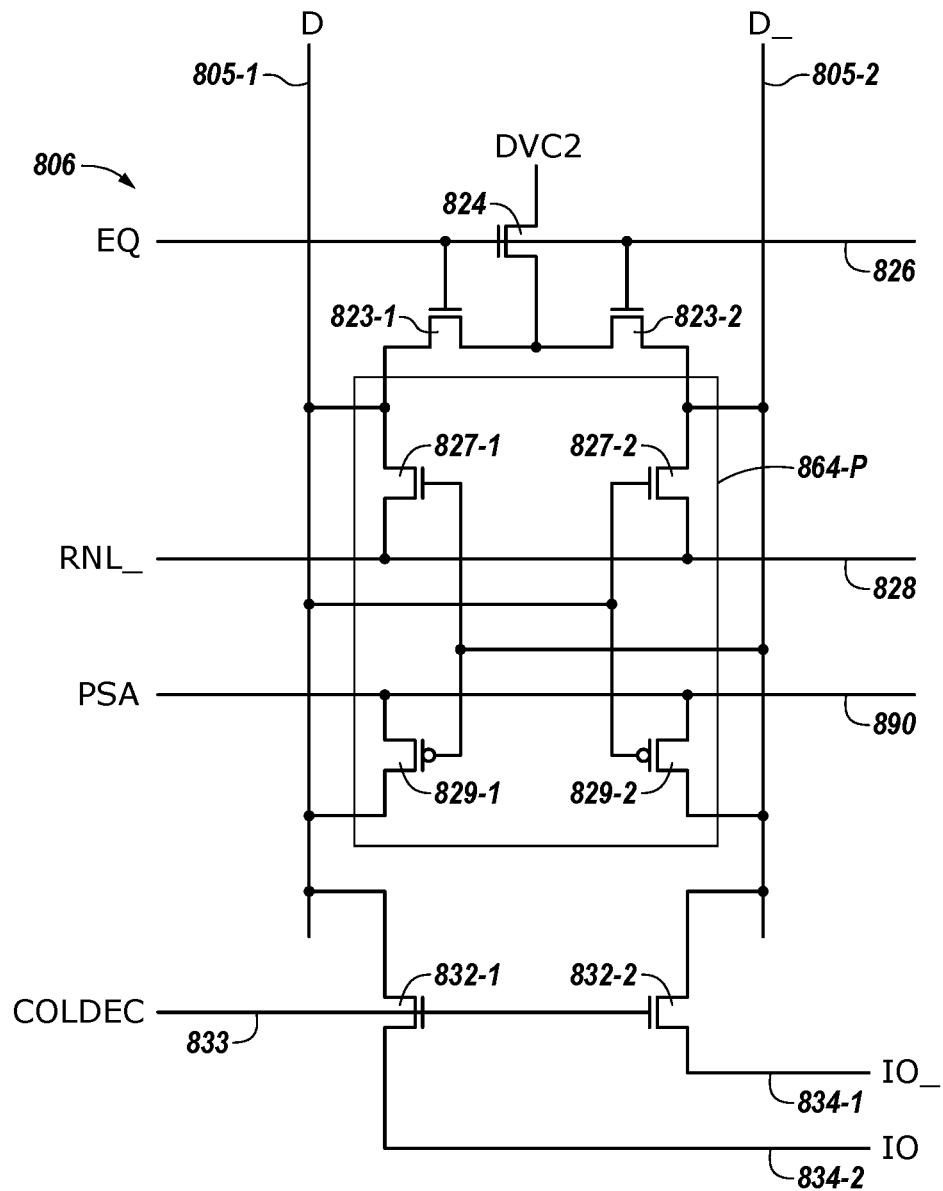
FIG. 8 is a schematic diagram illustrating a portion of sensing circuitry in accordance with a number of embodiments of the present disclosure.

FIG. 8 illustrates a timing diagram associated with performing a number of logical operations using sensing circuitry in accordance with a number of embodiments of the present disclosure. The timing diagram illustrated in FIG. 8 shows signals (e.g., voltage signals) associated with performing a last operation phase of a logical operation (e.g., an R-input logical operation). For instance, the timing diagram illustrated in FIG. 8 corresponds to a last operation phase of an R-input AND operation or an R-input OR operation.

For example, performing a last operation phase of an R-input can include performing the operation phase shown in FIG. 8 subsequent to a number of iterations of the intermediate operation phase(s) described in association with FIGS. 5 and/or 6. Table 1 shown below indicates the Figures corresponding to the sequence of operation phases associated with performing a number of R-input logical operations in accordance with a number of embodiments described herein.

TABLE 1

Figure 7:
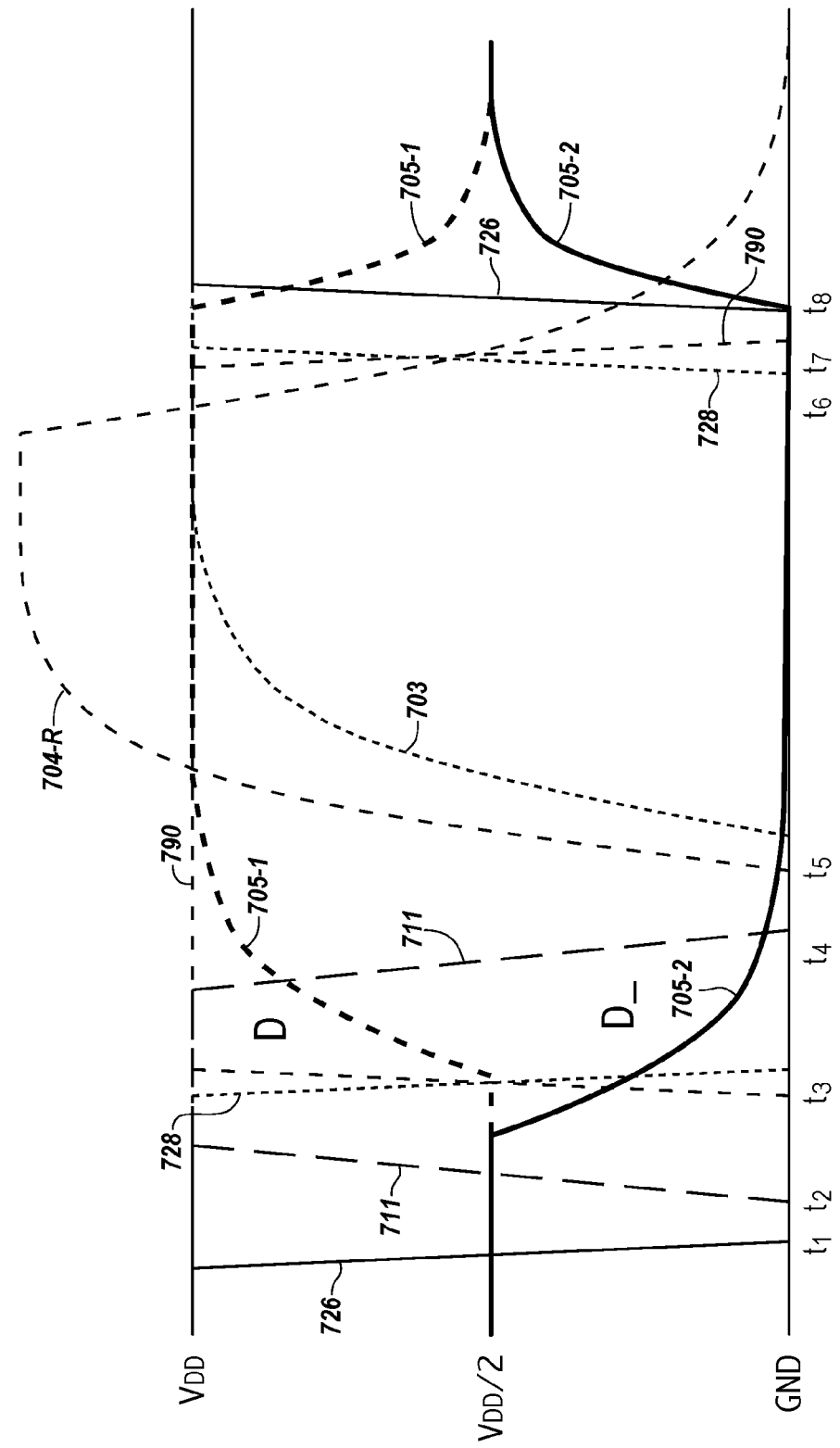
FIG. 7 illustrates a timing diagram associated with performing a number of logical operations using sensing circuitry in accordance with a number of embodiments of the present disclosure.

| Operation | FIG. 4 | FIG. 5 | FIG. 6 | FIG. 7 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

The last operation phase illustrated in the timing diagram of FIG. 8 is described in association with storing a result of an R-input logical operation to a row of the array (e.g., array 330 shown in FIG. 3). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 8, at time equilibration is deactivated (e.g., the equilibration signal 826 is deactivated) such that data lines D and D_ are floating. At time t2, the PASSD control signal 811 (and PASSDB signal) is activated for an AND or OR operation.

Activating the PASSD control signal 811 (and PASSDB signal) (e.g., in association with an AND or OR operation) transfers the accumulated output stored in the secondary latch 364-S of compute component 331 shown in FIG. 3 to the primary latch of sense amplifier 306. For instance, for an AND operation, if any of the memory cells sensed in the prior operation phases (e.g., the first operation phase illustrated in FIG. 4 and one or more iterations of the intermediate operation phase illustrated in FIG. 5) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 306 is then enabled (e.g., a positive control signal corresponding to PSA 890 shown in FIG. 8) goes high and the negative control signal 828 (e.g., corresponding to RNL_ 828 shown in FIG. 8) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 4 and one or more iterations of the intermediate operation phase shown in FIG. 6) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 306 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 330 shown in FIG. 3. In the examples shown in FIG. 8, the result of the R-input logical operation is stored to a memory cell coupled to the last row opened (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 8 show, at time t3, the positive control signal 890 and the negative control signal 828 being deactivated (e.g., signal 890 goes high and signal 828 goes low) to disable the sense amplifier 306 shown in FIG. 3. At time t4 the PASSD control signal 811 (and PASSDB signal) that was activated at time t2 is deactivated. Embodiments are not limited to this example. For instance, in a number of embodiments, the sense amplifier 306 shown in FIG. 3 may be enabled subsequent to time t4 (e.g., after he PASSD control signal 811 (and PASSDB signal) are deactivated).

As shown in FIG. 8, at time t5, a selected row is enabled (e.g., by row enabling signal 804 going high, which drives the capacitor of the selected cell to the voltage corresponding to the logic value stored in the accumulator. At time t6 the selected row is disabled. At time t7 the sense amplifier 306 shown in FIG. 3 is disabled (e.g., positive control signal 890 and negative control signal 828 are deactivated), and at time t8 equilibration occurs (e.g., signal 826 is activated and the voltages on the complementary data lines 805-1 (D) and 805-2 (D_) are brought to the equilibration voltage).

Although the example of performing a last operation phase of an R-input was discussed above with respect to FIG. 8 for performing AND and OR logical operations, embodiments are not limited to these logical operations. For example, the NAND and NOR operations can also involve a last operation phase of an R-input that is stored back to a memory cell of array 330 using control signals to operate the sensing circuitry illustrated in FIG. 3.

FIG. 8 is a schematic diagram illustrating a portion of sensing circuitry in accordance with a number of embodiments of the present disclosure. In this example, the portion of sensing circuitry comprises a sense amplifier 806. In a number of embodiments, one sense amplifier 806 (e.g., "sense amp") is provided for each column of memory cells in an array (e.g., array 130, 330). The sense amplifier 806 can be sense amplifier of a DRAM array, for instance. In this example, sense amplifier 806 is coupled to a pair of complementary data lines 805-1 (D) and 805-2 (D_). As such, the sense amplifier 806 can be coupled to all of the memory cells in a respective column through data lines 805-1 (D) and 805-2 (D_).

The sense amplifier 806 can include a pair of cross coupled n-channel transistors (e.g., NMOS transistors) 827-1 and 827-2 having their respective sources coupled to a negative control signal 428 (e.g., RNL_, RnIF) and their drains directly coupled to data lines 805-1 (D) and 805-2 (D_), respectively. According to some embodiments, the pair of cross coupled n-channel transistors (e.g., NMOS transistors) 827-1 and 827-2 can have their respective sources coupled directly and continuously to a reference voltage (e.g., ground). The sense amplifier 806 can also include a pair of cross coupled p-channel transistors (e.g., PMOS transistors) 829-1 and 829-2 having their respective sources coupled to a positive control signal 890 (e.g., PSA, ACT) and their drains directly coupled to data lines 805-1 (D) and 805-2 (D_), respectively. According to some embodiments, the pair of cross coupled p-channel transistors (e.g., PMOS transistors) 829-1 and 829-2 can have their respective sources coupled to directly and continuously to a supply voltage (e.g., $V_{DD}$).

The sense amplifier 806 can also include circuitry configured to equilibrate the data lines 805-1 (D) and 805-2 (D_). In this example, the equilibration circuitry comprises a transistor 824 having a first source/drain region coupled to an equilibration voltage (DVC2), which can be equal to $V_{DD}/2$, where $V_{DD}$ is a supply voltage associated with the array. A second source/drain region of transistor 824 can be directly coupled to a common first source/drain region of a pair of transistors 423-1 and 423-2. The second source drain regions of transistors 823-1 and 823-2 can be directly coupled to data lines 805-1 (D) and 805-2 (D_), respectively. The gates of transistors 824, 823-1, and 823-2 can be coupled to control signal 826 (EQ). As such, activating EQ enables the transistors 824, 823-1, and 823-2, which effectively shorts data line D to data line D_ such that the data lines 805-1 (D) and 805-2 (D_) are equilibrated to equilibration voltage DVC2.

The sense amplifier 806 can also include transistors 832-1 and 832-2 whose gates are coupled to a signal 833 (COLDEC). Signal 833 may be referred to as a column decode signal or a column select signal. The data lines 805-1 (D) and 805-2 (D_) can be coupled to respective local I/O lines 834-1 (IO) and 834-2 (IO_) responsive to activating signal 833 (e.g., to perform an operation such as a data line access in association with a read operation). As such, signal 833 can be activated to transfer a signal corresponding to the state (e.g., a logic data value such as logic "0" or logic "1") of the memory cell being accessed out of the array on the I/O lines 834-1 and 834-2.

In operation, when a memory cell is being sensed (e.g., read), the voltage on one of the data lines D or D_ will be slightly greater than the voltage on the other one of data lines D or D_. The PSA signal 890 is then driven high and the RNL_ signal 828 is driven low to enable the sense amplifier 806. The data line D or D_ having the lower voltage will turn on one of the PMOS transistor 479-1, 829-2 to a greater extent than the other of PMOS transistor 829-1, 829-2, thereby driving high the data line D or D_ having the higher voltage to a greater extent than the other data line D or D_ is driven high.

Similarly, the data line D or D_ having the higher voltage will turn on one of the NMOS transistor 827-1, 827-2 to a greater extent than the other of the NMOS transistor 827-1, 827-2, thereby driving low the data line D or D_ having the lower voltage to a greater extent than the other data line D or D_ is driven low. As a result, after a short delay, the data line D or D_ having the slightly greater voltage is driven to the voltage of the PSA signal 890 (which can be the supply voltage $V_{DD}$), and the other data line D or D_ is driven to the voltage of the RNL_ signal 828 (which can be a reference potential such as a ground potential). Therefore, the cross coupled NMOS transistors 827-1, 477-2 and PMOS transistors 829-1, 829-2 serve as a sense amplifier pair, which amplify the differential voltage on the data lines 805-1 (D) and 805-2 (D_) and serve to latch a data value sensed from the selected memory cell. As used herein, the cross coupled latch of sense amplifier 806 may be referred to as a primary latch 864-P. In contrast, and as described above in connection with FIG. 3, a cross coupled latch associated with a compute circuit (e.g., compute circuit 331 shown in FIG. 3) may be referred to as a secondary latch 364-S.

Referring back to FIG. 3, and with the sense amplifier 306 shown in FIG. 3 comprising the circuitry shown at 806 in FIG. 8, according to various embodiments of the present disclosure an apparatus (e.g., a memory array) can comprises an array of memory cells and sensing circuitry coupled to the array an array of memory cells and sensing circuitry coupled to the array. The sensing circuitry can include a sense amplifier (that includes the primary latch 864-P), and be configured to invert a data value stored in the latch. The sensing circuitry can further include a compute circuit that includes the secondary latch 364-S (e.g., an accumulator) coupled to the latch. The secondary latch can comprise a first pair of transistors and a second pair of transistors formed on pitch with memory cells of the array, for instance.

The primary latch 864-P shown in FIG. 8 and secondary latch 364-S shown in FIG. 3 of the sensing circuitry can be configured to invert the data value in the latch to be an inverted data value and retain the data value in the secondary latch. For example, the sensing circuitry can be configured and/or operated to copy the inverted data value from the primary latch 864-P to the secondary latch 364-S. The sensing circuitry can additionally comprise shift circuitry, which can be configured and/or operated to copy the inverted data value from the primary latch 864-P to the secondary latch 364-S with the array being isolated from the sensing circuitry.

Figure 9:
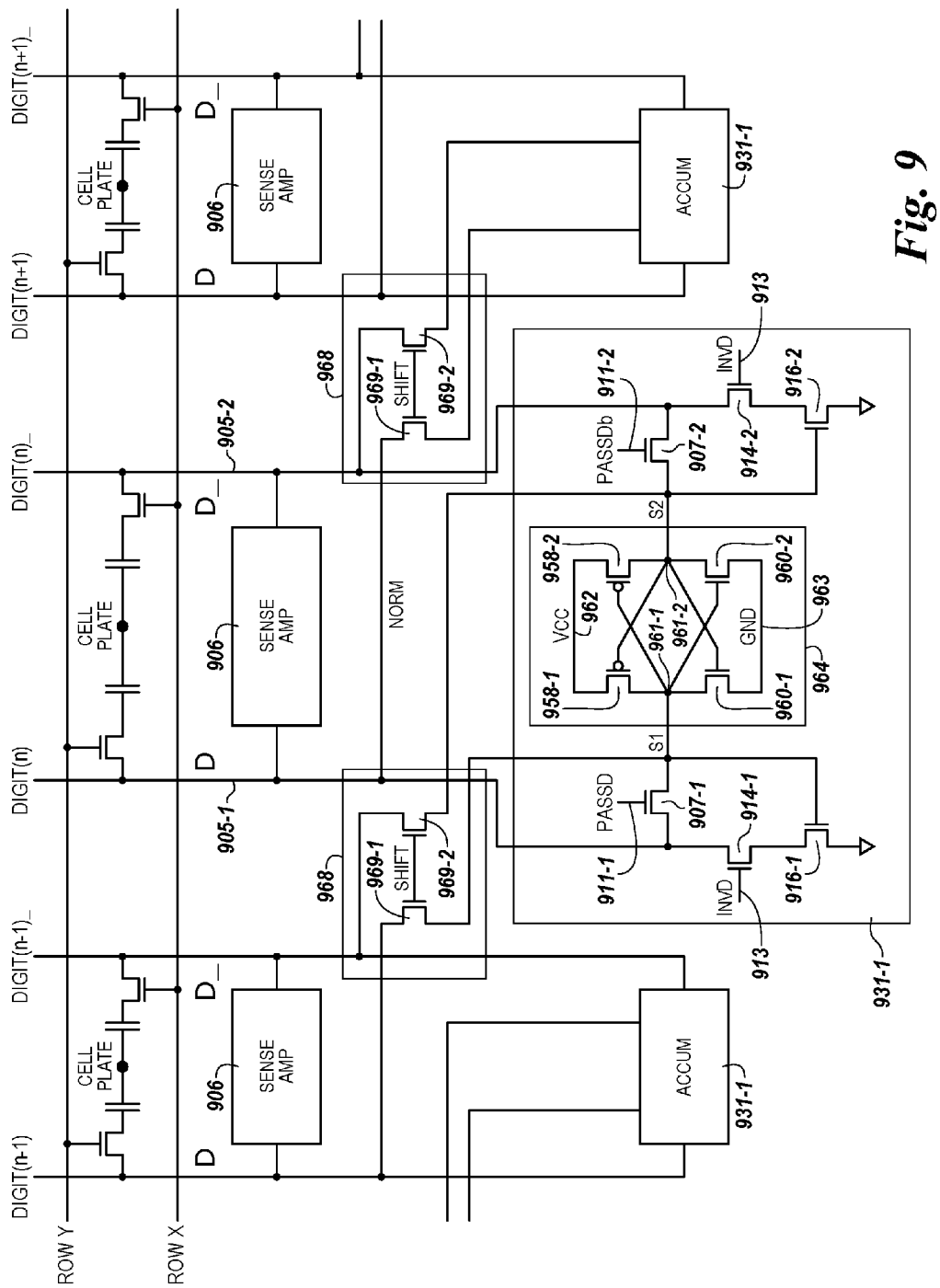
FIG. 9 is a schematic diagram illustrating sensing circuitry in accordance with a number of embodiments of the present disclosure.

FIG. 9 is a schematic diagram illustrating sensing circuitry in accordance with a number of embodiments of the present disclosure. The location and configuration of shift circuitry 968 is different than the location and configuration of shift circuitry 223 shown and discussed with respect to FIG. 2. Also the configuration of compute component 931-1 is different than the configuration of compute component 231 shown and discussed with respect to FIG. 2.

Shift circuitry 968 includes only two isolation transistors (e.g., 969-1 and 969-2) rather than four isolation transistors for shift circuitry 223 shown in FIG. 2. More particularly, shift circuitry 968 does not include isolation transistors intermediate in the data lines 905-1 (D) and 905-2 (D_). As such, the data lines are continuous between memory cells and sense amplifier 906 and compute component 931-1.

Sense amplifier 906 can correspond to sense amplifier 806 shown and described with respect to FIG. 8. The compute circuit 931-1 can be referred to as an accumulator (e.g., to accumulate certain data values). In the example illustrated in FIG. 9, the compute circuit 931-1 includes a latch 964 (e.g., a secondary latch). Latch 964 can be configured as a static latch, such as a cross coupled latch (e.g., coupled to gates of a pair of cross coupled transistors, such as cross coupled n-channel transistors (e.g., NMOS transistors) 960-1 and 960-2 and cross coupled p-channel transistors (e.g., PMOS transistors) 958-1 and 958-2).

In this example, a first latch input 961-1 (e.g., node S1) can be coupled to a first source/drain region of transistors 960-1 and 958-1, as well as to the gates of transistors 960-2 and 958-2. A second latch input 961-2 (e.g., node S2) can be coupled to a first source/drain region of transistors 960-2 and 958-2, as well as to the gates of transistors 960-1 and 958-1. A second source/drain region of transistor 960-1 and 960-2 can be commonly coupled to a negative control signal line 963. According to some embodiments, the negative control signal line 963 can be directly coupled to negative reference voltage (e.g., ground GND)), as indicated in FIG. 9. "Negative reference voltage" does not necessarily intend the voltage is negative with respect to ground, rather the negative reference voltage is relatively less positive than a positive reference voltage. A second source/drain region of transistors 958-1 and 958-2 can be commonly coupled to a positive control signal line 962. According to some embodiments, the positive control signal line 962 can be directly coupled to a positive reference voltage (e.g., supply voltage ($V_{DD}$)). The reference voltage and positive reference voltage can correspond to the voltages associated with different data values, for example.

Latch 964 operates to amplify a differential voltage between latch input 961-1 (S1) and latch input 961-2 (S2) such that latch input 961-1 (S1) is driven to one of the positive reference voltage or the negative reference voltage (e.g., to $V_{DD}$ or ground). Latch input 961-2 (S2) is driven to the other of the positive reference voltage or the negative reference voltage.

The compute component 931-1 can comprise a first source/drain region of pass transistor 907-1 coupled to data line 905-1 (D) and a first source/drain region of invert transistor 914-1. A second source/drain region of pass transistor 907-1 is coupled to latch input 961-1 (S1) and a gate of pull-down transistor 916-1. A first source/drain region of pass transistor 907-2 can be coupled to data line 705-2 (D_) and a first source/drain region of invert transistor 914-2. The voltages or currents on the respective data lines 705-1 (D) and 705-2 (D_) can be communicated to the respective latch inputs 961-1 (S1) and 961-2 (S2) of latch 964. A second source/drain region of pass transistor 907-2 can be coupled to latch input 961-2 (S2) and a gate of pull-down transistor 916-2. The compute component 931-1 utilizes strong pull-down transistors (e.g., 960-1 and 960-2) and weak pull-up transistors (e.g., 958-1 and 958-2) relative to the pull-up/pull-down transistors utilized by the sense amp.

The compute component 931-1 can further comprise a second source/drain region of invert transistor 914-1 coupled to a first source/drain region of pull-down transistor 916-1. A second source/drain region of pull-down transistors 916-1 can be coupled to the negative control signal line 963 (e.g., directly coupled to negative reference voltage such as ground (GND)). A second source/drain region of invert transistor 914-2 can be coupled to a first source/drain region of pull-down transistor 916-2. A second source/drain region of pull-down transistors 916-2 can be coupled to the negative control signal line 963.

A gate of pass transistor 907-1 can be coupled to a PASSD control signal line 911-1. A gate of pass transistor 907-2 can be coupled to a PASSDB control signal line 911-2. Gates of invert transistors 914-1 and 914-2 can be coupled to an INVD control signal line 913.

The circuit illustrated in FIG. 9 accomplishes a SHIFT function by using the secondary latch 964 of the compute component 931-1 and the primary latch of the sense amplifier 906 in a master-slave configuration. The operating sequences that follow describe the operations of components of the circuit shown in FIG. 9 to implement particular logical functions, such as AND or OR logical functions, with the result initially stored in the secondary latch 964 of the compute component 931-1 (e.g., accumulator). That is, the result of the logical function is not moved to the accumulator as a last step. According to embodiments of the present disclosure a data value is changed (or left unchanged) in the accumulator based on the inputs and particular logical function being implemented. The functionality of the sensing circuitry of FIG. 9 is summarized in Table 2 below.

TABLE 2

| Operation | Accumulator | Sense Amp |
|---|---|---|
| AND | Result | Unchanged |
| OR | Result | Unchanged |
| NOT | Unchanged | Result |
| SHIFT | Unchanged | Shifted Data |

Prior to performing a logical operation, an equilibrate operation can occur such that the complementary data lines 905-1 (D) and 905-2 (D_) are shorted together at an equilibration voltage (e.g., $V_{DD}/2$), as is described previously. An initial operation phase associated with performing an AND or an OR operation on a first data value and a second data value stored in memory cells coupled to different access lines can include loading the first data value into the accumulator of compute component 931-1.

According to embodiments of the present disclosure, operations to load data into the accumulator can be summarized as follows:

Copy Row X into the Accumulator:
  Deactivate EQ
  Enable Row X
  Fire Sense amplifiers (after which Row X data resides in the sense amplifiers)
  Activate PASSD and PASSDB (sense amplifier data (Row X) is transferred to nodes S1 and S2 of the Accumulator and resides there dynamically)
  Deactivate PASSD and PASSDB
  Disable Row X
  Precharge In the pseudo code above, "Deactivate EQ" indicates that an equilibration signal (EQ signal 826 shown in FIG. 8) corresponding to the sense amplifier 906 is deactivated and the complementary data lines (e.g., 905-1 (D) and 905-2 (D_) are no longer shorted to the equilibration voltage (e.g., $V_{DD}/2$). After equilibration is disabled, a selected row (e.g., ROW X) is enabled (e.g., selected, opened such as by activating a signal to select a particular row) as indicated by "Enable Row X" in the pseudo code. When the voltage signal applied to ROW X reaches the threshold voltage (Vt) of the access transistor (e.g., 302 shown in FIG. 3) corresponding to the selected cell, the access transistor turns on and couples the data line (e.g., 905-2 (D_)) to the selected cell (e.g., to capacitor 303 shown in FIG. 3) which creates a differential voltage signal between the data lines 905-1 (D) and 905-2 (D_).

After Row X is opened, in the pseudo code above, "Fire Sense amplifiers" indicates that the sense amplifier 906 is enabled to set the primary latch and subsequently disabled. The sense amplifier can be fired by the positive control signal (e.g., PSA 890 shown in FIG. 8) going high and the negative control signal (e.g., RNL_ 828 shown in FIG. 8) going low, which amplifies the differential signal between 905-1 (D) and D_ 905-2, resulting in a voltage (e.g., $V_{DD}$) corresponding to a logic "1" or a voltage (e.g., GND) corresponding to a logic "0" being on data line 905-1 (D) (and the voltage corresponding to the other logic state being on complementary data line 905-2 (D_)). The sensed data value is stored in the primary latch of sense amplifier 906. The primary energy consumption occurs in charging the data lines (e.g., 905-1 (D) or 905-2 (D_)) from the equilibration voltage $V_{DD}/2$ to the rail voltage $V_{DD}$.

After firing the sense amplifiers, in the pseudo code above, "Activate PASSD and PASSDB" indicates that the PASSD and PASSDB control signal goes high, causing pass transistors 907-1 and 907-2 to conduct. In this manner, activating the PASSD and PASSDB control signal enables the secondary latch 964 of the compute component 931-1. The sensed data value stored in the sense amplifier 906 is transferred (e.g., copied) to the secondary latch 964 so as to be stored on nodes S1 and S2.

After setting the secondary latch 964 from the data values stored in the sense amplifier 906 (and present on the data lines 905-1 (D) and 905-2 (D_), in the pseudo code above, "Deactivate PASSD and PASSDB" indicates that the PASSD and PASSDB control signal goes back low to cause the pass transistors 907-1 and 907-2 to stop conducting and thereby isolate the secondary latch 964 from the complementary data lines 905-1 (D) and 905-2 (D_). However, the data value remains stored in secondary latch 964 of the accumulator at nodes S1 and S2

After storing the data value in the secondary latch 964, the selected row (e.g., ROW X) is disabled as indicated by "Disable Row X", which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described previous, which is initiated by the EQ signal going high. The equilibrate operation causes the voltage on data lines 905-1 (D) and 905-2 (D_) to each return to $V_{DD}/2$. Equilibration can occur, for instance, prior to a next memory cell sensing operation or prior to the logical operations involving the stored data value(s) (described below).

A subsequent operation phase associated with performing the AND or the OR operation on the first data value (now stored in the sense amplifier 906 and the secondary latch 964 and a second data value stored in a memory cell (e.g., 302 shown in FIG. 3 coupled to Row Y) includes performing particular steps which depend on the whether an AND or an OR is to be performed. Examples of pseudo code associated with "ANDing" and "ORing" the data value residing in the accumulator and the data value stored in a memory cell are summarized below.

enabled to set the primary latch and subsequently disabled. Firing the sense amplifier 906 amplifies the differential signal between data lines 905-1 (D) and 905-2 (D_), resulting in a voltage (e.g., $V_{DD}$) corresponding to a logic "1" or a voltage (e.g., GND) corresponding to a logic "0" being on data line 905-1 (D) (and the voltage corresponding to the other logic state being on complementary data line 905-2 (D_)). The sensed second data value from the selected memory cell is stored in the primary latch of sense amplifier 906, as previously described. The secondary latch 964 is unchanged and still corresponds to the first data value.

After firing the sense amplifiers, in the pseudo code above, "Activate PASSD" indicates that the PASSD control signal goes high, causing pass transistor 907-1 to conduct, enabling the secondary latch 964 of the compute component 931-1 based on the voltage on data line 905-1 (D). Causing pass transistor 907-1 to conduct causes the value of the function (e.g., Row X AND Row Y) to be written to the secondary latch 964. If the secondary latch 964 contains a "0" (i.e., a voltage corresponding to a "0"), the "0" in the secondary latch 964 remains unchanged by the sense amplifier data (Row Y data). If the secondary latch 964 contains a "1" (i.e., a voltage corresponding to a "1"), the "1" in the secondary latch 964 is overwritten by the sense amplifier data (Row Y data). This operation leaves the data in the sense amplifier 906 unchanged.

In the pseudo code above, "Deactivate PASSD" indicates that the PASSD control signal goes back low to cause the pass transistor 907-1 to stop conducting and thereby isolate the secondary latch 964 from the complementary data lines 905-1 (D). Thereafter, the selected row (e.g., Row Y) is disabled as indicated by "Disable Row Y", which can be accomplished by the access transistor turning off to decouple the selected cell from the corresponding data line. Once the selected row is closed and the memory cell is isolated from the data lines, the data lines can be precharged as indicated by the "Precharge" in the pseudo code above (and previously described).

A subsequent operation phase can alternately be associated with performing the OR operation on the first data value (now stored in the sense amplifier 906 and the secondary latch 964) and the second data value (stored in a memory

```
Deactivate EQ
Enable Row Y
Fire Sense amplifiers (after which Row Y data resides in the sense amplifier)
Activate PASSD
   This results in the accumulator latch being written to the value of the
      function (e.g., RowX AND RowY)
Deactivate PASSD
Disable Row Y
Precharge
```

In the pseudo code above, "Deactivate EQ" indicates that an equilibration signal corresponding to the sense amplifier 906 is disabled (e.g., such that the complementary data lines 905-1 (D) and 905-2 (D_) are no longer shorted to $V_{DD}/2$). After equilibration is disabled, a selected row (e.g., ROW Y) is enabled as indicated in the pseudo code above by "Enable Row Y". When the voltage signal applied to ROW Y reaches the threshold voltage (Vt) of the access transistor corresponding to the selected cell, the access transistor turns on and couples the data line to the selected cell which creates a differential voltage signal between the data lines 905-1 (D) and 905-2 (D_).

After Row Y is opened, in the pseudo code above, "Fire Sense amplifiers" indicates that the sense amplifier 906 is cell coupled to Row Y) (e.g., Row X OR Row Y). The operations to load the Row X data into the primary latch of the sense amplifier 906 and the secondary latch 964 were previously described. Example pseudo code associated with "ORing" the data values is summarized below.

```
Deactivate EQ
Enable Row Y
Fire Sense amplifiers (after which Row Y data resides in the sense
amplifier)
Activate PASSDB
   This results in the accumulator latch being written to the value of the
      function (e.g., Row X OR Row Y)
```

-continued

```
Deactivate PASSDB
Disable Row Y
Precharge
```

In the pseudo code above, "Deactivate EQ," "Enable Row Y," and "Fire Sense" operations are the same as those discussed above with respect to the AND operation. After firing the sense amplifiers, in the pseudo code above, "Activate PASSDB" indicates that the PASSDB control signal goes high, causing pass transistor 907-2 to conduct, enabling the secondary latch 964 of the compute component 931-1 based on the voltage on data line 905-2 (D_). Causing pass transistor 907-2 to conduct causes the value of the function (e.g., Row X OR Row Y) to be written to the secondary latch 964. If the secondary latch 964 contains a "0" (i.e., a voltage corresponding to a "0"), the "0" in the secondary latch 964 is overwritten by the sense amplifier data (Row Y data). If the secondary latch 964 contains a "1" (i.e., a voltage corresponding to a "1"), the "1" in the secondary latch 964 remains unchanged by the sense amplifier data (Row Y data). This operation leaves the data in the sense amplifier 906 unchanged.

In the pseudo code above, "Deactivate PASSDB" indicates that the PASSDB control signal goes back low to cause the pass transistor 907-2 to stop conducting and thereby isolate the secondary latch 964 from the complementary data lines 905-2 (D_). Thereafter, the selected row (e.g., Row Y) is disabled as indicated by "Disable Row Y", which can be accomplished by the access transistor turning off to decouple the selected cell from the corresponding data line. Once the selected row is closed and the memory cell is isolated from the data lines, the data lines can be precharged as indicated by the "Precharge" in the pseudo code above (and previously described).

The circuit illustrated in FIG. 9 uses the secondary latch 964 to control inverting. A gate of pull-down transistors 916-1 and 916-2 are coupled to respective inputs of the secondary latch 964. An invert function is implemented by storing a non-inverted data value into the secondary latch 964, and then using that data value to invert the sense amplifier 906. Operations to invert the data in the sense amplifier 906 (NOT (Row X)) (after Row X has been copied into the accumulator) are summarized below.

```
Deactivate EQ
Activate InvD
Fire Sense amplifier (after which inverse Row X data resides in the
sense amplifier)
   Activate PASSD and PASSDB
   Disable Row X
   Precharge
```

In the pseudo code above, the "Deactivate EQ" operation is the same as discussed above with respect to the AND and OR operations. In the pseudo code above, "Activate InvD" indicates that the InvD control signal goes high, causing invert transistors 914-1 and 914-2 to conduct. Depending on the data value stored in the secondary latch 964, one of the pull-down transistor 916-1 and 916-2 will also be on and conducting. If the secondary latch 964 contains a "0" (i.e., a voltage corresponding to a "0"), the S2 node of the secondary latch 964 will be high and the pull-down transistor 916-2 will be conducting, thereby pulling-down data line 905-2 (D_). If the secondary latch 964 contains a "1" (i.e., a voltage corresponding to a "1"), the S1 node of the secondary latch 964 will be high and the pull-down transistor 916-1 will be conducting, thereby pulling-down data line 905-1 (D). That is the data line that was high to set the secondary latch 964 (and the sense amplifier) causing the data lines to indicate an opposite data value than that stored in the secondary latch 964 and sense amplifier 906.

In the pseudo code above, "Fire Sense amplifiers" indicates that the sense amplifier 906 is enabled to amplify the differential signal between data lines 905-1 (D) and 905-2 (D_), and store the inverted data value on the data lines 905-1 (D) and 905-2 (D_) in the primary latch of sense amplifier 906. The secondary latch 964 is unchanged.

In the pseudo code above, "Activate PASSD and PASSDB" indicates that the PASSD and PASSDB control signal goes high, causing pass transistors 907-1 and 907-2 to conduct, which causes the enabled secondary latch 964 to also store the inverted data value. The secondary latch 964 is enabled because the positive control signal line 962 is coupled to $V_{DD}$ and the negative control signal line 963 is coupled to ground. Thereafter, the selected row (e.g., Row X) is disabled as indicated by "Disable Row X", which can be accomplished by the access transistor turning off to decouple the selected cell from the corresponding data line. Once the selected row is closed and the memory cell is isolated from the data lines, the data lines can be precharged as indicated by the "Precharge" in the pseudo code above (and previously described).

Note that the inverted data value is written to the Row X memory cell since Row X is opened when the respective latches fire. Inverse Row X data can be transferred into any Row and/or back into the secondary latch 964 by opening the appropriate Row and/or pass transistors (e.g., via PASSD and PASSDB control signals). Inverse Row X data can avoid being transferred into a particular Row and/or back into the secondary latch 964 by ensuring that the appropriate Row and/or pass transistors (e.g., via PASSD and PASSDB control signals) are closed before firing respective latches to drive data line voltages to the rails.

According to another embodiment of the present disclosure, the operation shown in the pseudo code below can be implemented by the sense amplifier 906 and compute component 931-1 to invert the data in the compute component 931-1 (assuming the data to be inverted already resides in the compute component 931-1 and also assuming the no row is opened).

```
Deactivate EQ
Activate InvD
Fire Sense Amplifier
Activate PASSD and PASSDB
Deactivate PASSD and PASSDB
Precharge
```

In the pseudo code above, after the sense amplifier is fired an inverse of the data stored in the compute component resides in the sense amplifier. An inverse of the data stored in the compute component can be transferred to any row by opening the appropriate row (e.g., by enabling memory cell access devices coupled to the row). Activating PASSD and PASSDB, as shown in the pseudo code above, transfers the inverted data in the sense amplifier to the compute component. Precharge equilibrates the data lines, as previously discussed above.

According to another embodiment of the present disclosure, the operation shown in the pseudo code below can be implemented by the sense amplifier 906 and compute component 931-1 to invert the data in the compute component 931-1 (assuming the data to be inverted resides in Row X and that the Row X data is not to be changed).

```
Deactivate EQ
Enable Row X
Fire Sense Amplifier
Activate PASSD and PASSDB
Deactivate PASSD and PASSDB
Disable Row X
Activate InvD
Deactivate InvD
Activate PASSD and PASSDB
Deactivate PASSD and PASSDB
Precharge
```

In the pseudo code above, after firing the sense amplifier 906 the Row X data is loaded into the sense amplifier 906 from Row X. Activating the PASSD and PASSDB signals after firing the sense amplifier 906 transfers the data from the sense amplifier 906 (e.g., Row X data) to the compute component 931-1. Disabling Row X after the PASSD and PASSDB signals are deactivated prevents the original Row X data from being changed. After disabling Row X, activating InvD flips the latch in the sense amplifier 906 so that the data in the sense amplifier 906 is now inverted (e.g., with respect to the Row X data). Activating InvD does not change (e.g., does not invert) the data in the compute component 931-1. A new row could be opened at this point to in which to store the inverted row X data residing in the sense amplifier 906.

An inverse of the data stored in the compute component 931-1 can be transferred to any row by opening the appropriate row (e.g., by enabling memory cell access devices coupled to the row). Activating PASSD and PASSDB, as shown in the pseudo code above, transfers the inverted data in the sense amplifier 906 to the compute component 931-1. Deactivate the InvD signal disables the inverting transistor 914-1. Activating and deactivating PASSD and PASSDB transfers the data in the sense amplifier 906 (e.g., inverted Row X data) to the compute component 931-1. Precharge equilibrates the data lines, as previously discussed above.

According to another embodiment of the present disclosure, the operation shown in the pseudo code below can be implemented by the sense amplifier 906 and compute component 931-1 to invert the data stored in Row X with the compute component 931-1 storing the initial Row X data (e.g., un-inverted).

```
Deactivate EQ
Enable Row X
Fire Sense Amplifier
Activate PASSD and PASSDB
Deactivate PASSD and PASSDB
Activate InvD
Deactivate InvD
Disable Row X
Precharge
```

In the pseudo code above, after firing the sense amplifier 906 the Row X data is loaded into the sense amplifier 906 from Row X. Activating the PASSD and PASSDB signals after firing the sense amplifier 906 transfers the data from the sense amplifier 906 (e.g., Row X data) to the compute component 931-1. In contrast to the previous pseudo code, Row X is not disabled after the PASSD and PASSDB signals are deactivated; therefore Row X remains opened and the data therein can be changed. After deactivating PASSD and PASSDB, activating InvD flips the latch in the sense amplifier 906 so that the data in the sense amplifier 906 and the data in Row X are now inverted (e.g., with respect to the original Row X data). Activating InvD does not change (e.g., does not invert) the data in the compute component 931-1, which retains the original Row X data (e.g., un-inverted).

After the Row X data is inverted in Row X and the sense amplifier 906, disabling Row X after the PASSD and PASSDB signals are deactivated prevents the Row X data (e.g., inverted original Row X data) from being further changed. Precharge equilibrates the data lines, as previously discussed above.

According to another embodiment of the present disclosure, the operation shown in the pseudo code below can be implemented by the sense amplifier 906 and compute component 931-1 to invert the data stored in Row X after which the inverted Row X data is stored back in Row X, in the compute component 931-1, and in the sense amplifier 906.

```
Deactivate EQ
Enable Row X
Fire Sense Amplifier
Activate PASSD and PASSDB
Deactivate PASSD and PASSDB
Activate InvD
Deactivate InvD
Activate PASSD and PASSDB
Deactivate PASSD and PASSDB
Disable Row X
Precharge
```

In the pseudo code above, after firing the sense amplifier 906 the Row X data is loaded into the sense amplifier 906 from Row X. Activating the PASSD and PASSDB signals after firing the sense amplifier 906 transfers the data from the sense amplifier 906 (e.g., Row X data) to the compute component 931-1. In contrast to the previous pseudo code, Row X is not disabled after the PASSD and PASSDB signals are deactivated; therefore Row X remains opened and the data therein can be changed. After deactivating PASSD and PASSDB, activating InvD flips the latch in the sense amplifier 906 so that the data in the sense amplifier 906 and the data in Row X are now inverted (e.g., with respect to the original Row X data). Activating InvD does not change (e.g., does not invert) the data in the compute component 931-1, which retains the original Row X data (e.g., un-inverted).

After the Row X data is inverted in Row X and the sense amplifier 906, activating and deactivating PASSD and PASSDB transfers the inverted data from the sense amplifier 906 (e.g., inverted Row X data) to the compute component 931-1. Thereafter, disabling Row X prevents the Row X data (e.g., inverted original Row X data) from being further changed. Precharge equilibrates the data lines, as previously discussed above.

According to embodiments of the present disclosure, SHIFT operations (right or left) sensing circuitry illustrated in FIG. 9 do not pre-copy the Row X data value into the accumulator. One example method for shifting the Row X data value to the right can include writing Row X data value from a pair of adjacent complementary data lines into a compute circuit 931-1 without storing the Row X data value in to a sense amplifier 906. This can be accomplished using the sensing circuitry illustrated in FIG. 9 because the shift circuitry is coupled between the secondary latch 964 and the pass transistors 907-1 and 907-2. Thereafter, the Row X data value can be stored from the compute circuit 931-1 to the sense amplifier 906. Before storing the data value from the compute circuit 931-1 to the sense amplifier 906 a pair of complementary data lines to which the sense amplifier 906 is coupled can be equilibrated.

After equilibration of the pair of complementary data lines 905-1 (D) and 905-2 (D_), the Row X data value can be communicated from the compute circuit 931-1 to the pair of complementary data lines 905-1 (D) and 905-2 (D_) and subsequently stored to the sense amplifier 906. The pair of adjacent complementary data lines 905-1 (D) and 905-2 (D_) can be isolated from the compute circuit before equilibrating the pair of complementary data lines. Communicating the Row X data value from the compute circuit 931-1 to the pair of complementary data lines 905-1 (D) and 905-2 (D_) can be accomplished by connecting the compute circuit 931-1 to the pair of complementary data lines 905-1 (D) and 905-2 (D_) through the pass transistors 907-1 and 907-2 prior to sensing the data value by the sense amplifier 906. The compute circuit 931-1 can be isolated from the pair of complementary data lines 905-1 (D) and 905-2 (D_) after sensing the data value by the sense amplifier 906. Operations to shift right Row X are summarized below.

Activate Shift
Deactivate Shift
Activate EQ
Deactivate EQ
Activate PASSD and PASSDB
Fire Sense amplifiers
Deactivate PASSD and PASSDB In the pseudo code above, "Activate Shift" indicates that the SHIFT control signal applied to the gates of the isolation transistors 969-1 and 969-2 goes high, causing isolation transistors 969-1 and 969-2 to conduct, which couples an adjacent set of complementary data line to the secondary latch 964. Sense amplifier 906 data is written into the secondary latch 964 one set of complementary data lines to the right. In the pseudo code above, "Deactivate Shift" indicates that the SHIFT control signal applied to the gates of the isolation transistors 969-1 and 969-2 goes low, causing isolation transistors 969-1 and 969-2 to stop conducting, which decouples the adjacent set of complementary data line from the secondary latch 964.

In the pseudo code above, "Activate EQ" indicates that an equilibration of the complementary data lines 905-1 (D) and 905-2 (D_) is initiated, and "Deactivate EQ" indicates that the equilibration signal corresponding to the sense amplifier 906 is disabled (e.g., such that the complementary data lines 905-1 (D) and 905-2 (D_) are no longer shorted to $V_{DD}/2$).

In the pseudo code above, "Activate PASSD and PASSDB" indicates that the PASSD and PASSDB control signal goes high, causing pass transistors 907-1 and 907-2 to conduct, which couples the adjacent data lines to the complementary data lines 905-1 (D) and 905-2 (D_). In the pseudo code above, "Fire Sense amplifiers" indicates that the sense amplifier 906 is enabled to amplify the differential signal between data lines 905-1 (D) and 905-2 (D_), and store the data value on the adjacent data lines and the data lines 905-1 (D) and 905-2 (D_) in the primary latch of sense amplifier 906 (which is also stored in the continuously-enabled secondary latch 964 as well). In the pseudo code above, "Deactivate PASSD and PASSDB" indicates that the PASSD and PASSDB control signal goes low, causing pass transistors 907-1 and 907-2 to stop conducting, and separating the adjacent data lines and the data lines 905-1 (D) and 905-2 (D_) again.

One example method for shifting the Row X data value to the left implemented using the sensing circuitry illustrated in FIG. 9 can include loading the Row X data value from a sense amplifier 906 coupled to a pair of complementary data lines 905-1 (D) and 905-2 (D_) into a compute circuit 931-1 coupled to the pair of complementary data lines 905-1 (D) and 905-2 (D_). The compute circuit 931-1 can be isolated from the pair of complementary data lines 905-1 (D) and 905-2 (D_), and the sense amplifier 906 can be coupled to a pair of right-adjacent complementary data lines. The Row X data value can be stored from the pair of adjacent complementary data lines to the sense amplifier 906.

Loading the Row X data value from the sense amplifier 906 into the compute circuit 931-1 can include connecting the compute circuit 931-1 to the pair of complementary data lines 905-1 (D) and 905-2 (D_) through pass transistor 907-1 and 907-2. Storing the Row X data value from the pair of adjacent complementary data lines to the sense amplifier 906 can include equilibrating the pair of complementary data lines 905-1 (D) and 905-2 (D_) to which the sense amplifier 906 is coupled before connecting the sense amplifier 906 to the pair of adjacent complementary data lines through the pass transistors 907-1 and 907-2. Once the Row X data value is stored in the sense amplifier 906, the sense amplifier 906 can be isolated from the pair of adjacent complementary data lines. Operations to shift left Row X are summarized below.

Activate PASSD and PASSDB
Deactivate PASSD and PASSDB
Equilibrate (EQ) data lines
Deactivate EQ
Activate Shift
Fire Sense amplifiers
Deactivate Shift In the pseudo code above, "Activate PASSD and PASSDB" indicates that the PASSD and PASSDB control signal goes high, causing pass transistors 907-1 and 907-2 to conduct, which couples the secondary latch 964 to the complementary data lines 905-1 (D) and 905-2 (D_). Because secondary latch 964 is continuously enabled (e.g., with positive control voltage line 962 coupled to $V_{DD}$ and negative control voltage line coupled to ground 963), a data value stored in the sense amplifier 906, which is on the complementary data lines 905-1 (D) and 905-2 (D_), is copied into the secondary latch 964. In the pseudo code above, "Deactivate PASSD and PASSDB" indicates that the PASSD and PASSDB control signal goes low, causing pass transistors 907-1 and 907-2 to stop conducting, isolating the secondary latch 964 from the complementary data lines 905-1 (D) and 905-2 (D_).

In the pseudo code above, "Activate EQ" indicates that an equilibration of the complementary data lines 905-1 (D) and 905-2 (D_) is initiated, and "Deactivate EQ" indicates that the equilibration signal corresponding to the sense amplifier 906 is disabled (e.g., such that the complementary data lines 905-1 (D) and 905-2 (D_) are no longer shorted to $V_{DD}/2$).

In the pseudo code above, "Activate Shift" indicates that the SHIFT control signal applied to the gates of the isolation transistors 969-1 and 969-2 goes high, causing isolation transistors 969-1 and 969-2 to conduct, which couples an adjacent set of complementary data line to the secondary latch 964. In the pseudo code above, "Fire Sense amplifiers" indicates that the sense amplifier 906 is enabled to amplify the differential signal between data lines 905-1 (D) and 905-2 (D_), and store the data value on the data lines 905-1

(D) and 905-2 (D_) in the primary latch of sense amplifier 906, after which shifted data resides in the sense amplifiers 906. The secondary latch 964 is unchanged. In the pseudo code above, "Deactivate Shift" indicates that the SHIFT control signal applied to the gates of the isolation transistors 969-1 and 969-2 goes low, causing isolation transistors 969-1 and 969-2 to stop conducting, which decouples the adjacent set of complementary data line from the secondary latch 964.

The shift cycle is faster since a Row cycle can be eliminated. Power can be reduced because a Row is not opened; thus, there is no associated charging and discharging of the memory cells. Power can also be reduced using the sensing circuitry configuration shown in FIG. 9 with shift circuitry 968 versus using the shift circuitry 223 shown in FIG. 2 because an elevated voltage (e.g., 3.0 V) is applied to the isolation transistors of the shift circuitry 223 (e.g., 221-1, 221-2, 221-3, 221-4 shown in FIG. 2), whereas $V_{DD}$ (e.g., 1.2 V) is utilized in implementing SHIFT functionality using the shift circuitry 968 illustrated in FIG. 9.

Figure 10:
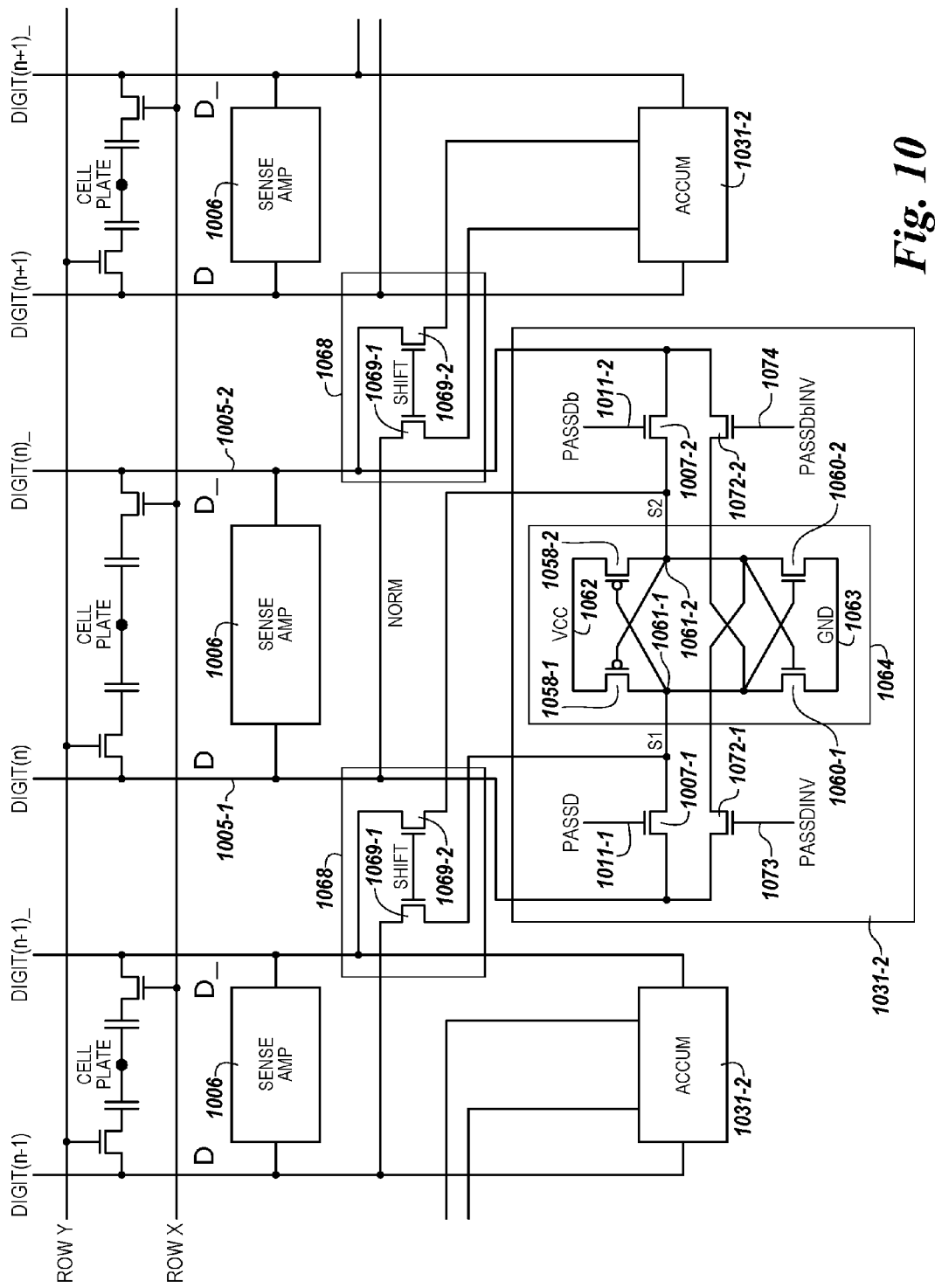
FIG. 10 is a schematic diagram illustrating sensing circuitry in accordance with a number of embodiments of the present disclosure.

FIG. 10 is a schematic diagram illustrating sensing circuitry in accordance with a number of embodiments of the present disclosure. The circuit illustrated in FIG. 10, compared to the circuit illustrated in FIG. 9, has a modified invert transistor configuration, including elimination of the pull-down transistors (e.g., 916-1 and 916-2 shown in FIG. 9). Also, similar to the circuit shown in FIG. 9, shift circuitry 1068 shown in FIG. 10 does not include isolation transistors intermediate in the complementary data lines 1005-1 (D) and 1005-2 (D_).

Sense amplifier 1006 can correspond to sense amplifier 806 shown and described with respect to FIG. 8. The configuration of compute circuit 1031-2 is different than the configuration of compute circuit 331 shown and described with respect to FIG. 3, and is different than the configuration of compute circuit 931-1 shown and described with respect to FIG. 9, as described in further detail below.

The compute circuit 1031-2 can operate as an accumulator, for example. In the example illustrated in FIG. 10, the compute circuit 1031-2 includes a latch 1064 (e.g., a secondary latch). Secondary latch 1064 can be configured somewhat similar to latch 964 shown and described with respect to FIG. 9. Latch 1064 can be a cross coupled latch (e.g., coupled to gates of a pair of cross coupled transistors, such as cross coupled n-channel transistors (e.g., NMOS transistors) 1060-1 and 1060-2 and cross coupled p-channel transistors (e.g., PMOS transistors) 1058-1 and 1058-2).

In this example, a first latch input 1061-1 (S1) can be coupled to a first source/drain region of transistors 1060-1 and 1058-1 as well as to the gates of transistors 1060-2 and 1058-2. Similarly, a second latch input 1061-2 (S2) can be coupled to a first source/drain region of transistors 1060-2 and 1058-2 as well as to the gates of transistors 1060-1 and 1058-1. A second source/drain region of transistor 1060-1 and 1070-2 can be commonly coupled to a reference voltage (e.g., ground GND)). A second source/drain region of transistors 1058-1 and 1058-2 can be commonly coupled to a positive reference voltage (e.g., supply voltage ($V_{DD}$)). The positive and negative reference voltages can correspond to the voltages associated with different data values, for example.

The cross coupled latch 1064 operates to amplify a differential voltage between latch input 1061-1 (S1) and latch input 1071-2 (S2) such that latch input 1061-1 is driven to one of the positive reference voltage or the negative reference voltage (e.g., to $V_{DD}$ or ground), and latch input 1061-2 is driven to the other of the positive reference voltage or the negative reference voltage.

A first source/drain region of pass transistor 1007-1 can be coupled to data line 1005-1 (D) and a first source/drain region of invert transistor 1072-1. A second source/drain region of pass transistor 1007-1 can be coupled to latch input 1061-1 (S1). A second source/drain region of invert transistor 1072-1 can be coupled to latch input 1061-2 (S2).

A first source/drain region of pass transistor 1007-2 can be coupled to data line 1005-2 (D_) and a first source/drain region of invert transistor 1072-2. A second source/drain region of pass transistor 1007-2 can be coupled to latch input 1061-2 (S2). A second source/drain region of invert transistor 1072-2 can be coupled to latch input 1061-1 (S1). In this manner, the voltages or currents on the respective data lines 1005-1 (D) and 1005-2 (D_) can be communicated to the respective latch inputs 1061-1 and 1061-2 of the secondary latch 1064.

A gate of pass transistor 1007-1 can be coupled to a PASSD control signal line 1011-1. A gate of pass transistor 1007-2 can be coupled to a PASSDB control signal line 1011-2. A gate of invert transistor 1072-1 can be coupled to a PASSDINVD control signal line 1073. A gate of invert transistor 1072-2 can be coupled to a PASSDBINVD control signal line 1074.

Implementation of AND, OR, and SHIFT functions are the same as implemented and described with respect to the sensing circuitry illustrated in FIG. 9. However, the NOT (e.g., invert) function is implemented differently by the sensing circuitry illustrated in FIG. 10 than the NOT (e.g., invert) function is implemented by the circuit illustrated in FIG. 9 The circuit illustrated in FIG. 10 is configured using two less transistors than the circuit illustrated in FIG. 9. The pull-down transistors (e.g., 916-1 and 16-2 shown in FIG. 9) are eliminated in the circuit illustrated in FIG. 10, which can result in a smaller footprint for the circuit, and smaller die size. The circuit illustrated in FIG. 10 can also operate faster for some functions than, for example, the circuit illustrated in FIG. 3, 2, or 9.

In contrast with the circuit illustrated in FIG. 9, which uses the secondary latch 964 to control invert transistors 916-1 and 916-2 (e.g., gates of the pull-down transistors 916-1 and 916-2 are coupled to a respective secondary latch input S1 or S2), the circuit illustrated in FIG. 10 connects the complementary nodes of the secondary latch 1064 (e.g., S1 and S2) to the data lines 1005-1 (D) and 1005-2 (D_) through the invert transistors 1072-1 and 1072-2. With a complement data state on the data lines 1005-1 (D) and 1005-2 (D_), an invert function can be performed by using the sense amplifier 1006 to "sense" the complement state of the secondary latch 1064 as the inverted data value. As such, the result of the invert function resides in the sense amplifier 1006. The secondary latch 1064 is not strong enough to overpower the sense amplifier 1006 thereby causing it to flip state. That is, the sense amplifier 1006 has to fire in order to sense the complement state placed on the data lines 1005-1 (D) and 1005-2 (D_) and flip to correspond to that sensed complement state.

Operations to invert the data in the sense amplifier (NOT (Row X)) (after Row X has been copied into the accumulator) are summarized below.

Deactivate EQ
Activate PASSDINV and PASSDBINV
Fire Sense amplifier

Deactivate PASSD and PASSDB (if activated)
Disable Row X
Precharge

In the pseudo code above, the "Deactivate EQ" operation is the same as discussed above to conclude an equilibration of data lines 1005-1 (D) and 1005-2 (D_). In the pseudo code above, "Activate PASSDINV and PASSDBINV" indicates that the signal on the PASSDINV control signal line 1073 and the PASSDBINV control signal line 1074 go high, causing invert transistors 1072-1 and 1072-2 to conduct, which couples the data lines 1005-1 (D) and 1005-2 (D_) to the secondary latch 1064 in an opposite orientation than that accomplished through the pass transistors 1007-1 and 1007-2 (e.g., data line 1005-1 (D) is coupled to S2 of the secondary latch 1064 and data line 1005-2 (D_) is coupled to S1 of the secondary latch 1064). Because the secondary latch 1064 is continuously enabled (e.g., 1062 is coupled to $V_{DD}$ and 1063 is coupled to ground), the inverted data value is stored in the secondary latch 1064 through the invert transistors 1072-1 and 1072-2.

In the pseudo code above, "Fire Sense amplifiers" indicates that the sense amplifier 1006 is enabled to amplify the differential signal between data lines 1005-1 (D) and 1005-2 (D_), resulting in a voltage (e.g., $V_{DD}$) corresponding to a logic "1" or a voltage (e.g., GND) corresponding to a logic "0" being on data line 1005-1 (D) (and the voltage corresponding to the other logic state being on complementary data line 1005-2 (D_)). The sensed data value from the data lines 1005-1 (D) and 1005-2 (D_) is stored in the primary latch of sense amplifier 1006, as previously described. After firing the sense amplifier the inverse Row X data resides in the sense amplifier. The secondary latch 1064 is unchanged. After the sense amplifiers 1006 are fired the inverse Row X data resides in the sense amplifier 1006. Inverse Row X data can be transferred into any row or back into the compute component by opening the appropriate row and/or PASSD and PASSDB.

The inverse Row X data can be transferred into any Row or back into the secondary latch 1064 by opening the appropriate Row and/or pass transistors 1007-1 and 1007-2. For example, in the pseudo code above, "Deactivate PASSD and PASSDB" indicates that the PASSD and PASSDB control signals 1011-1 and 1011-2 go low, causing pass transistors 1007-1 and 1007-2 to not conduct. The secondary latch 1064 is enabled because the positive control signal line 1062 is coupled to $V_{DD}$ and the negative control signal line 1063 is coupled to ground.

Thereafter, the selected row (e.g., Row X) can disabled as indicated by "Disable Row X", which can be accomplished by the access transistor turning off to decouple the selected cell from the corresponding data line. Once the selected row is closed and the memory cell is isolated from the data lines, the data lines can be precharged as indicated by the "Precharge" in the pseudo code above (and previously described).

Figure 11:
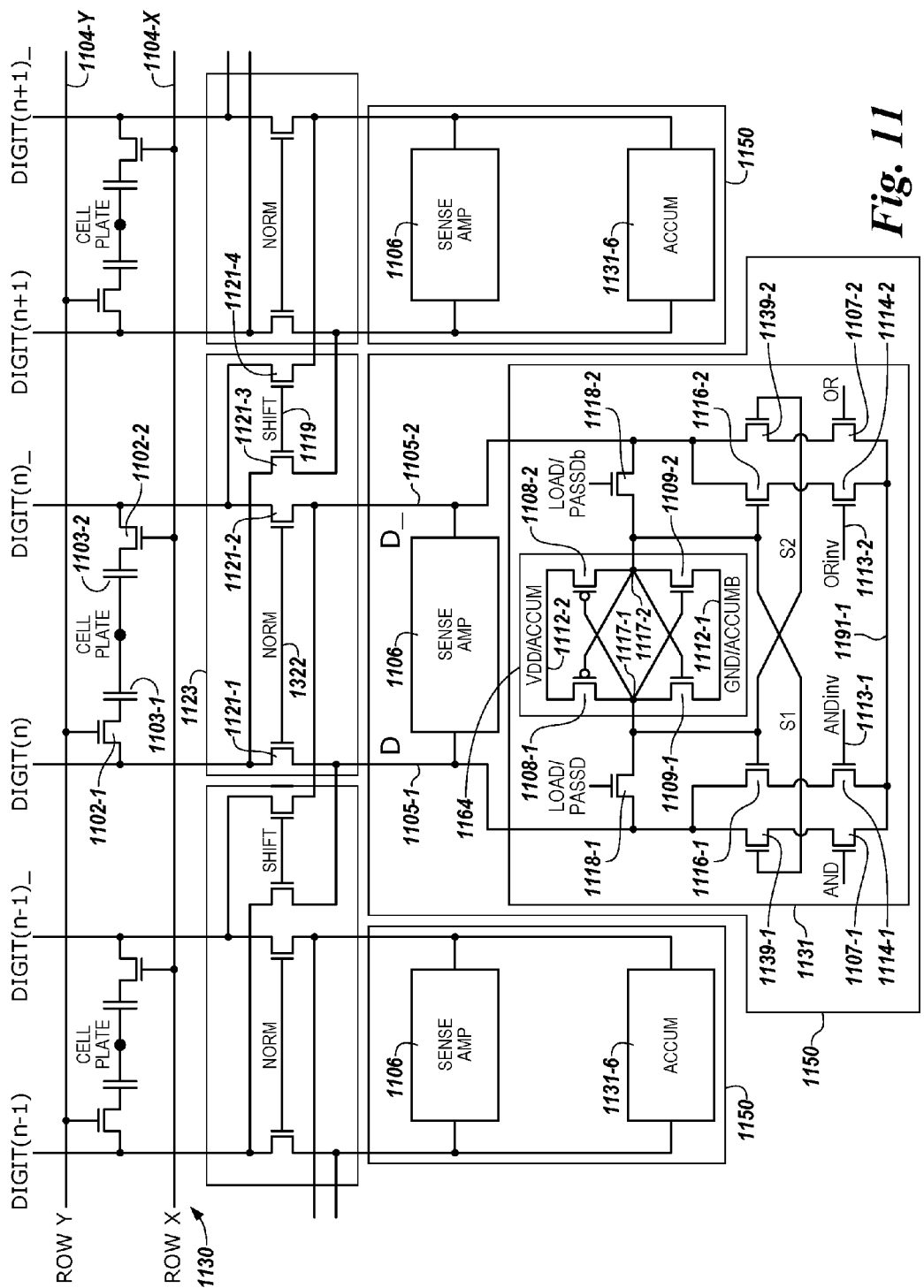
FIG. 11 is a schematic diagram illustrating sensing circuitry in accordance with a number of embodiments of the present disclosure.

FIG. 11 is a schematic diagram illustrating sensing circuitry in accordance with a number of embodiments of the present disclosure. A memory cell comprises a storage element (e.g., capacitor) and an access device (e.g., transistor). For instance, transistor 1102-1 and capacitor 1103-1 comprises a memory cell, and transistor 1102-2 and capacitor 1103-2 comprises a memory cell, etc. In this example, the memory array 1130 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 1130 are arranged in rows coupled by word lines 1104-X (Row X), 1104-Y (Row Y), etc., and columns coupled by pairs of complementary data lines DIGIT(n−1)/DIGIT (n−1)_, DIGIT(n)/DIGIT(n)_, DIGIT(n+1)/DIGIT(n+1)_. The individual data lines corresponding to each pair of complementary data lines can also be referred to as data lines 1105-1 (D) and 1105-2 (D_) respectively. Although only three pair of complementary data lines are shown in FIG. 11, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 1102-1 can be coupled to data line 1105-1 (D), a second source/drain region of transistor 1102-1 can be coupled to capacitor 1103-1, and a gate of a transistor 1102-1 can be coupled to word line 1104-X. A first source/drain region of a transistor 1102-2 can be coupled to data line 1105-2 (D_), a second source/drain region of transistor 1102-2 can be coupled to capacitor 1103-2, and a gate of a transistor 1102-2 can be coupled to word line 1104-Y. The cell plate, as shown in FIG. 11, can be coupled to each of capacitors 1103-1 and 1103-2. The cell plate can be a common node to which a reference voltage (e.g., ground) can be applied in various memory array configurations.

The memory array 1130 is coupled to sensing circuitry 1150 in accordance with a number of embodiments of the present disclosure. In this example, the sensing circuitry 1150 comprises a sense amplifier 1106 and a compute component 1131 corresponding to respective columns of memory cells (e.g., coupled to respective pairs of complementary data lines). The sense amplifier 1106 can comprise a cross coupled latch, which can be referred to herein as a primary latch. The sense amplifier 1106 can be configured, for example, as described with respect to FIG. 12.

In the example illustrated in FIG. 11, the circuitry corresponding to compute component 1131 comprises a static latch 1164 and an additional ten transistors that implement, among other things, a dynamic latch. The dynamic latch and/or static latch of the compute component 1131 can be collectively referred to herein as a secondary latch, which can serve as an accumulator. As such, the compute component 1131 can operate as and/or be referred to herein as an accumulator. The compute component 1131 can be coupled to each of the data lines D 1105-1 and D_ 1105-2 as shown in FIG. 11. However, embodiments are not limited to this example. The transistors of compute component 1131 can all be n-channel transistors (e.g., NMOS transistors), for example.

In this example, data line D 1105-1 can be coupled to a first source/drain region of transistors 1116-1 and 1139-1, as well as to a first source/drain region of load/pass transistor 1118-1. Data line D_ 1105-2 can be coupled to a first source/drain region of transistors 1116-2 and 1139-2, as well as to a first source/drain region of load/pass transistor 1118-2.

The gates of load/pass transistor 1118-1 and 1118-2 can be commonly coupled to a LOAD control signal, or respectively coupled to a PASSD/PASSDB control signal, as discussed further below. A second source/drain region of load/pass transistor 1118-1 can be directly coupled to the gates of transistors 1116-1 and 1139-2. A second source/ drain region of load/pass transistor 1118-2 can be directly coupled to the gates of transistors 1116-2 and 1139-1.

A second source/drain region of transistor 1116-1 can be directly coupled to a first source/drain region of pull-down transistor 1114-1. A second source/drain region of transistor 1139-1 can be directly coupled to a first source/drain region of pull-down transistor 1107-1. A second source/drain region of transistor 1116-2 can be directly coupled to a first source/drain region of pull-down transistor 1114-2. A second source/drain region of transistor 1139-2 can be directly coupled to a first source/drain region of pull-down transistor 1107-2. A second source/drain region of each of pull-down transistors 1107-1, 1107-2, 1114-1, and 1114-2 can be commonly coupled together to a reference voltage line 1191-1 (e.g., ground (GND)). A gate of pull-down transistor 1107-1 can be coupled to an AND control signal line, a gate of pull-down transistor 1114-1 can be coupled to an ANDinv control signal line 1113-1, a gate of pull-down transistor 1114-2 can be coupled to an ORinv control signal line 1113-2, and a gate of pull-down transistor 1107-2 can be coupled to an OR control signal line.

The gate of transistor 1139-1 can be referred to as node S1, and the gate of transistor 1139-2 can be referred to as node S2. The circuit shown in FIG. 11 stores accumulator data dynamically on nodes S1 and S2. Activating the LOAD control signal causes load/pass transistors 1118-1 and 1118-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 11 is not contingent on the LOAD control signal being elevated to a voltage greater than $V_{DD}$.

The configuration of compute component 1131 shown in FIG. 11 has the benefit of balancing the sense amplifier for functionality when the pull-down transistors 1107-1, 1107-2, 1114-1, and 1114-2 are conducting before the sense amplifier 1106 is fired (e.g., during pre-seeding of the sense amplifier 1106). As used herein, firing the sense amplifier 1106 refers to enabling the sense amplifier 1106 to set the primary latch and subsequently disabling the sense amplifier 1106 to retain the set primary latch. Performing logical operations after equilibration is disabled (in the sense amplifier), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 1116-1 (having a gate coupled to S2 of the dynamic latch) in series with transistor 1114-1 (having a gate coupled to an ANDinv control signal line 1113-1) can be operated to pull-down data line 1105-1 (D), and transistor 1116-2 (having a gate coupled to S1 of the dynamic latch) in series with transistor 1114-2 (having a gate coupled to an ANDinv control signal line 1113-2) can be operated to pull-down data line 1105-2 (D_).

The latch 1164 can be controllably enabled by coupling to an active negative control signal line 1112-1 (ACCUMB) and an active positive control signal line 1112-2 (ACCUM) rather than be configured to be continuously enabled by coupling to ground and $V_{DD}$. In various embodiments, load/pass transistors 1108-1 and 1108-2 can each having a gate coupled to one of a LOAD control signal or a PASSD/PASSDB control signal.

According to some embodiments, the gates of load/pass transistors 1118-1 and 1118-2 can be commonly coupled to a LOAD control signal. In the configuration where the gates of load/pass transistors 1118-1 and 1118-2 are commonly coupled to the LOAD control signal, transistors 1118-1 and 1118-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 11 is not contingent on the LOAD control signal being elevated to a voltage greater than $V_{DD}$.

According to some embodiments, the gate of load/pass transistor 1118-1 can be coupled to a PASSD control signal, and the gate of load/pass transistor 1118-2 can be coupled to a PASSDb control signal. In the configuration where the gates of transistors 1118-1 and 1118-2 are respectively coupled to one of the PASSD and PASSDb control signals, transistors 1118-1 and 1118-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 1123, as shown in FIG. 11). According to some embodiments, load/pass transistors 1118-1 and 1118-2 can be configured to accommodate the heavier loading corresponding to a pass transistor but be coupled and operated as a load transistor. Load/pass transistors 1118-1 and 1118-2 configured as pass transistors can also be utilized as load transistors. However, load/pass transistors 1118-1 and 1118-2 configured as load transistors may not be capable of being utilized as pass transistors.

In a number of embodiments, the compute component 1131, including the latch 1164, can comprise a number of transistors formed on pitch with the transistors of the corresponding memory cells of an array (e.g., array 1130 shown in FIG. 11) to which they are coupled, which may conform to a particular feature size (e.g., $4F^2$, $6F^2$, etc.). According to various embodiments, latch 1164 includes four transistors 1108-1, 1108-2, 1109-1, and 1109-2 coupled to a pair of complementary data lines D 1105-1 and D_ 1105-2 through load/pass transistors 1118-1 and 1118-2. However, embodiments are not limited to this configuration. The latch 1164 can be a cross coupled latch (e.g., gates of a pair of transistors, such as n-channel transistors (e.g., NMOS transistors) 1109-1 and 1109-2 are cross coupled with the gates of another pair of transistors, such as p-channel transistors (e.g., PMOS transistors) 1108-1 and 1108-2). As described further herein, the cross coupled latch 1164 can be referred to as a static latch.

The voltages or currents on the respective data lines D and D_ can be provided to the respective latch inputs 1117-1 and 1117-2 of the cross coupled latch 1164 (e.g., the input of the secondary latch). In this example, the latch input 1117-1 is coupled to a first source/drain region of transistors 1108-1 and 1109-1 as well as to the gates of transistors 1108-2 and 1109-2. Similarly, the latch input 1117-2 can be coupled to a first source/drain region of transistors 1108-2 and 1109-2 as well as to the gates of transistors 1108-1 and 1109-1.

In this example, a second source/drain region of transistor 1109-1 and 1109-2 is commonly coupled to a negative control signal line 1112-1 (e.g., ground (GND) or ACCUMB control signal similar to control signal RnIF shown in FIG.

12 with respect to the primary latch). A second source/drain region of transistors 1108-1 and 1108-2 is commonly coupled to a positive control signal line 1112-2 (e.g., $V_{DD}$ or ACCUM control signal similar to control signal ACT shown in FIG. 12 with respect to the primary latch). The positive control signal 1112-2 can provide a supply voltage (e.g., $V_{DD}$) and the negative control signal 1112-1 can be a reference voltage (e.g., ground) to enable the cross coupled latch 1164. According to some embodiments, the second source/drain region of transistors 1108-1 and 1108-2 are commonly coupled directly to the supply voltage (e.g., $V_{DD}$), and the second source/drain region of transistor 1109-1 and 1109-2 are commonly coupled directly to the reference voltage (e.g., ground) so as to continuously enable latch 1164.

The enabled cross coupled latch 1164 operates to amplify a differential voltage between latch input 1117-1 (e.g., first common node) and latch input 1117-2 (e.g., second common node) such that latch input 1117-1 is driven to either the activated positive control signal voltage (e.g., $V_{DD}$) or the activated negative control signal voltage (e.g., ground), and latch input 1117-2 is driven to the other of the activated positive control signal voltage (e.g., $V_{DD}$) or the activated negative control signal voltage (e.g., ground).

Figure 12:
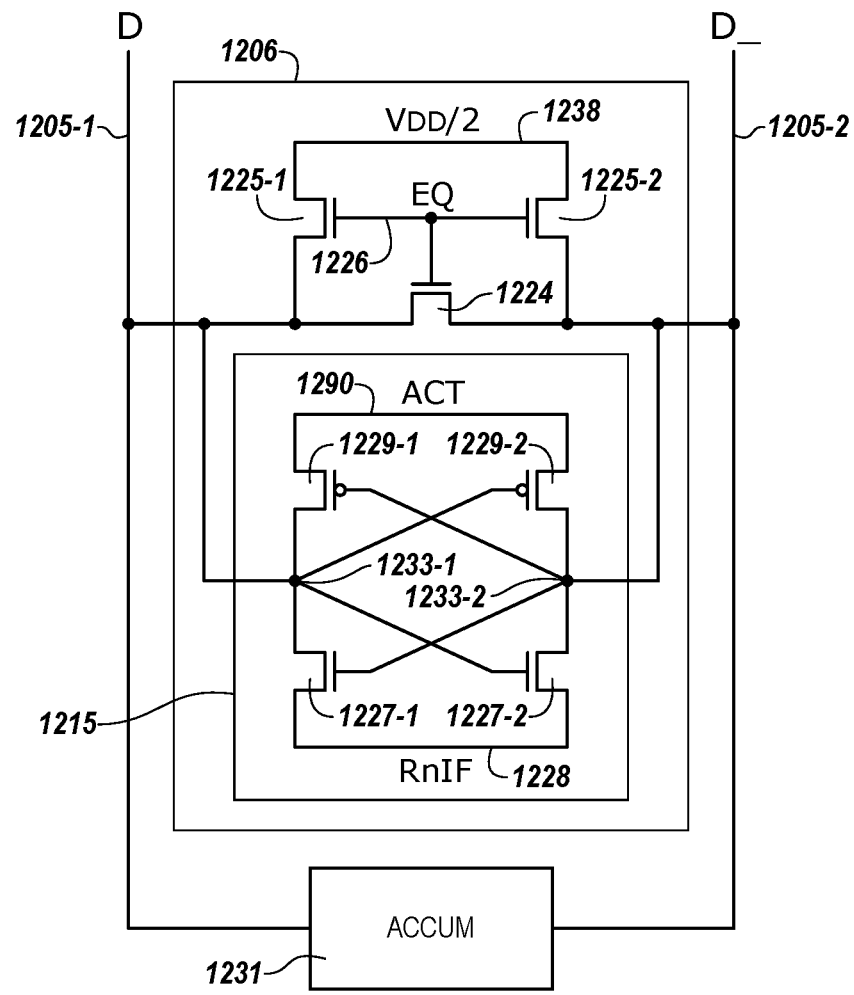
FIG. 12 is a schematic diagram illustrating a portion of sensing circuitry in accordance with a number of embodiments of the present disclosure.

FIG. 12 is a schematic diagram illustrating a portion of sensing circuitry in accordance with a number of embodiments of the present disclosure. According to various embodiments, sense amplifier 1206 can comprise a cross coupled latch. However, embodiments of the sense amplifier 1206 are not limited to the a cross coupled latch. As an example, the sense amplifier 1206 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 1206) can comprise a number of transistors formed on pitch with the transistors of the corresponding compute component 1231 and/or the memory cells of an array (e.g., 1130 shown in FIG. 11) to which they are coupled, which may conform to a particular feature size (e.g., $4F^2$, $6F^2$, etc.). The sense amplifier 1206 comprises a latch 1215 including four transistors coupled to a pair of complementary data lines D 1205-1 and D_ 1205-2. The latch 1215 can be a cross coupled latch (e.g., gates of a pair of transistors, such as n-channel transistors (e.g., NMOS transistors) 1227-1 and 1227-2 are cross coupled with the gates of another pair of transistors, such as p-channel transistors (e.g., PMOS transistors) 1229-1 and 1229-2). As described further herein, the latch 1215 comprising transistors 1227-1, 1227-2, 1229-1, and 1229-2 can be referred to as a primary latch. However, embodiments are not limited to this example.

The voltages or currents on the respective data lines D and D_ can be provided to the respective latch inputs 1233-1 and 1233-2 of the cross coupled latch 1215 (e.g., the input of the secondary latch). In this example, the latch input 1233-1 is coupled to a first source/drain region of transistors 1227-1 and 1229-1 as well as to the gates of transistors 1227-2 and 1229-2. Similarly, the latch input 1233-2 can be coupled to a first source/drain region of transistors 1227-2 and 1229-2 as well as to the gates of transistors 1227-1 and 1229-1. The compute component 1233 (e.g., accumulator) can be coupled to latch inputs 1233-1 and 1233-2 of the cross coupled latch 1215 as shown; however, embodiments are not limited to the example shown in FIG. 12.

In this example, a second source/drain region of transistor 1227-1 and 1227-2 is commonly coupled to an active negative control signal 1228 (RnIF). A second source/drain region of transistors 1229-1 and 1229-2 is commonly coupled to an active positive control signal 1290 (ACT). The ACT signal 1290 can be a supply voltage (e.g., $V_{DD}$) and the RnIF signal can be a reference voltage (e.g., ground). Activating signals 1228 and 1290 enables the cross coupled latch 1215.

The enabled cross coupled latch 1215 operates to amplify a differential voltage between latch input 1233-1 (e.g., first common node) and latch input 1233-2 (e.g., second common node) such that latch input 1233-1 is driven to one of the ACT signal voltage and the RnIF signal voltage (e.g., to one of $V_{DD}$ and ground), and latch input 1233-2 is driven to the other of the ACT signal voltage and the RnIF signal voltage.

The sense amplifier 1206 can also include circuitry configured to equilibrate the data lines D and D_ (e.g., in association with preparing the sense amplifier for a sensing operation). In this example, the equilibration circuitry comprises a transistor 1224 having a first source/drain region coupled to a first source/drain region of transistor 1225-1 and data line D 1205-1. A second source/drain region of transistor 1224 can be coupled to a first source/drain region of transistor 1225-2 and data line D_ 1205-2. A gate of transistor 1224 can be coupled to gates of transistors 1225-1 and 1225-2.

The second source drain regions of transistors 1225-1 and 1225-2 are coupled to an equilibration voltage 1238 (e.g., $V_{DD}/2$), which can be equal to $V_{DD}/2$, where $V_{DD}$ is a supply voltage associated with the array. The gates of transistors 1224, 1225-1, and 1225-2 can be coupled to control signal 1225 (EQ). As such, activating EQ enables the transistors 1224, 1225-1, and 1225-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 11, the sense amplifier 1106 and the compute component 1131 can be coupled to the array 1130 via shift circuitry 1123. In this example, the shift circuitry 1123 comprises a pair of isolation devices (e.g., isolation transistors 1121-1 and 1121-2) coupled to data lines 1105-1 (D) and 1105-2 (D_), respectively). The isolation transistors 1121-1 and 1121-2 are coupled to a control signal 1122 (NORM) that, when activated, enables (e.g., turns on) the isolation transistors 1121-1 and 1121-2 to couple the corresponding sense amplifier 1106 and compute component 1131 to a corresponding column of memory cells (e.g., to a corresponding pair of complementary data lines 1105-1 (D) and 1105-2 (D_)). According to various embodiments, conduction of isolation transistors 1121-1 and 1121-2 can be referred to as a "normal" configuration of the shift circuitry 1123.

In the example illustrated in FIG. 11, the shift circuitry 1123 includes another (e.g., a second) pair of isolation devices (e.g., isolation transistors 1121-3 and 1121-4) coupled to a complementary control signal 1119 (SHIFT), which can be activated, for example, when NORM is deactivated. The isolation transistors 1121-3 and 1121-4 can be operated (e.g., via control signal 1119) such that a particular sense amplifier 1106 and compute component 1131 are coupled to a different pair of complementary data lines (e.g., a pair of complementary data lines different than the pair of complementary data lines to which isolation transistors 1121-1 and 1121-2 couple the particular sense amplifier 1106 and compute component 1131), or can couple a particular sense amplifier 1106 and compute component 1131 to another memory array (and isolate the particular sense amplifier 1106 and compute component 1131 from a first memory array). According to various embodiments, the shift circuitry 1123 can be arranged as a portion of (e.g., within) the sense amplifier 1106, for instance.

Although the shift circuitry 1123 shown in FIG. 11 includes isolation transistors 1121-1 and 1121-2 used to couple particular sensing circuitry 1150 (e.g., a particular sense amplifier 1106 and corresponding compute component 1131) to a particular pair of complementary data lines 1105-1 (D) and 1105-2 (D_) (e.g., DIGIT(n) and DIGIT(n)_) and isolation transistors 1121-3 and 1121-4 are arranged to couple the particular sensing circuitry 1150 to an adjacent pair of complementary data lines in one particular direction (e.g., adjacent data lines DIGIT(n+1) and DIGIT(n+1)_ shown to the right in FIG. 11), embodiments of the present disclosure are not so limited. For instance, shift circuitry can include isolation transistors 1121-1 and 1121-2 used to couple particular sensing circuitry to a particular pair of complementary data lines (e.g., DIGIT(n) and DIGIT(n)_ and isolation transistors 1121-3 and 1121-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 11).

Embodiments of the present disclosure are not limited to the configuration of shift circuitry 1123 shown in FIG. 11. In a number of embodiments, shift circuitry 1123 such as that shown in FIG. 11 can be operated (e.g., in conjunction with sense amplifiers 1106 and compute components 1131) in association with performing compute functions such as adding and subtracting functions without transferring data out of the sensing circuitry 1150 via an I/O line (e.g., local I/O line (IO/IO_)), for instance.

Although not shown in FIG. 11, each column of memory cells can be coupled to a column decode line that can be activated to transfer, via local I/O line, a data value from a corresponding sense amplifier 1106 and/or compute component 1131 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 1123 can be operated in conjunction with sense amplifiers 1106 and compute components 1131 to perform compute functions such as adding and subtracting functions without transferring data to a control component external to the array, for instance.

The sensing circuitry 1150 can be operated in several modes to perform logical operations, including a first mode in which a result of the logical operation is initially stored in the compute component 1131, and a second mode in which a result of the logical operation is initially stored in the sense amplifier 1106. Operation of the sensing circuitry 1150 in the first mode is similar to the operations described for the sensing circuitry 250 shown in FIG. 2 and the timing diagrams shown in FIGS. 4-7 (the difference being that the additional dynamic latch of the compute component 1131 operates together with the state static latch 1164 of the compute component 1131). Operation of the sensing circuitry 1150 in the second mode is described below with respect to FIGS. 13 and 14. Additionally with respect to the second operating mode, sensing circuitry 1150 can be operated in both pre-sensing (e.g., sense amps fired before logical operation control signal active) and post-sensing (e.g., sense amps fired after logical operation control signal active) modes with a result of a logical operation being initially stored in the sense amplifier 1106.

As described further below, the sense amplifier 1106 can, in conjunction with the compute component 1131, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 1150 of FIG. 11 is described below and summarized in Table 3 below with respect to performing logical operations and initially storing a result in the sense amplifier 1106. Initially storing the result of a particular logical operation in the primary latch of sense amplifier 1106 can provide improved versatility as compared to previous approaches in which the result may initially reside in a secondary latch (e.g., accumulator) of a compute component 1131, and then be subsequently transferred to the sense amplifier 1106, for instance.

TABLE 3

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 1106 (e.g., without having to perform an additional operation to move the result from the compute component 1131 (e.g., accumulator) to the sense amplifier 1106) is advantageous because, for instance, the result can be written to a row (of the array of memory cells) or back into the accumulator without performing a precharge cycle (e.g., on the complementary data lines 1105-1 (D) and/or 1105-2 (D_)).

Figure 13:
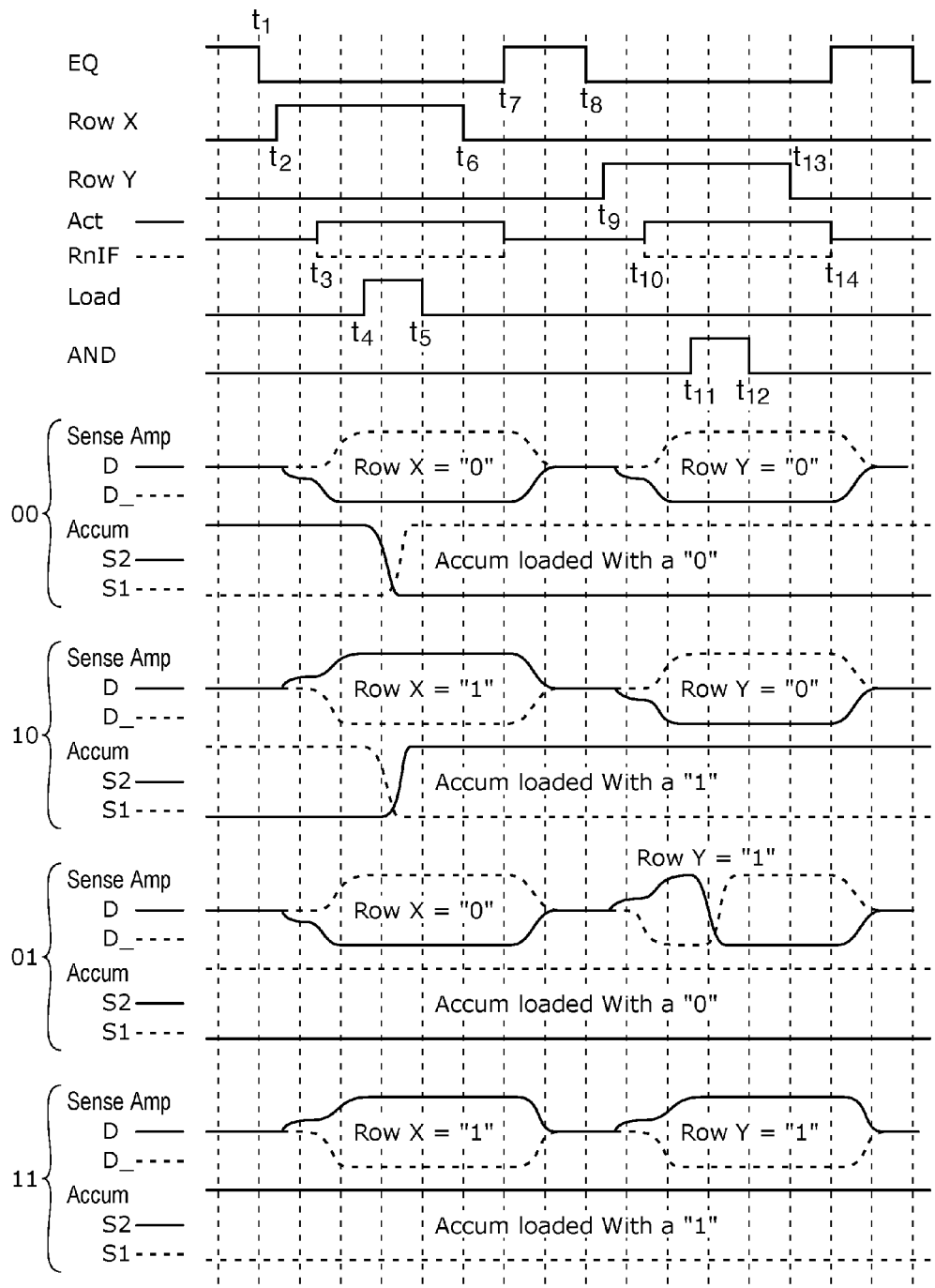
FIG. 13 illustrates a timing diagram associated with performing a number of logical operations using sensing circuitry in accordance with a number of embodiments of the present disclosure.

FIG. 13 illustrates a timing diagram associated with performing a number of logical operations using sensing circuitry in accordance with a number of embodiments of the present disclosure. FIG. 13 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 13 illustrates a number of control signals associated with operating sensing circuitry (e.g., 1150) to perform the AND logical operation. "EQ" corresponds to an equilibrate signal applied to the sense amplifier 1106, "ROW X" corresponds to an activation signal applied to access line 1104-X, "ROW Y" corresponds to an activation signal applied to access line 1104-Y, "Act" and "RnIF" correspond to a respective active positive and negative control signal applied to the sense amplifier 1106, "LOAD" corresponds to a load control signal (e.g., LOAD/PASSD and LOAD/PASSDb shown in FIG. 11), and "AND" corresponds to the AND control signal shown in FIG. 11. FIG. 13 also illustrates the waveform diagrams showing the signals (e.g., voltage signals) on the digit lines D and D_ corresponding to sense amplifier 1106 and on the nodes S1 and S2 corresponding to the compute component 1131 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 11.

An example of pseudo code associated with loading (e.g., copying) a first data value stored in a cell coupled to row 1104-X into the accumulator can be summarized as follows:

Copy Row X into the Accumulator:
  Deactivate EQ
  Enable Row X
  Fire Sense amplifiers
  Activate LOAD (sense amplifier data (Row X) is transferred to nodes
    S1 and S2 of the Accumulator and resides there dynamically)
  Deactivate LOAD
  Disable Row X
  Precharge In the pseudo code above, "Deactivate EQ" indicates that an equilibration signal (EQ signal shown in FIG. 13) corresponding to the sense amplifier 1106 is disabled at $t_1$ as shown in FIG. 13 (e.g., such that the complementary data lines (e.g., 1105-1 (D) and 1105-2 (D_) are no longer shorted to $V_{DD}/2$). After equilibration is disabled, a selected row (e.g., ROW X) is enabled (e.g., selected, opened such as by activating a signal to select a particular row) as indicated by "Enable Row X" in the pseudo code and shown at $t_2$ for signal Row X in FIG. 13. When the voltage signal applied to ROW X reaches the threshold voltage (Vt) of the access transistor (e.g., 1102-2) corresponding to the selected cell, the access transistor turns on and couples the data line (e.g., 1105-2 (D_)) to the selected cell (e.g., to capacitor 1103-2) which creates a differential voltage signal between the data lines.

After Row X is enabled, in the pseudo code above, "Fire Sense amplifiers" indicates that the sense amplifier 1106 is enabled to set the primary latch and subsequently disabled. After firing the sense amplifiers Row X data resides in the sense amplifiers. For example, as shown at $t_3$ in FIG. 13, the ACT positive control signal (e.g., 1290 shown in FIG. 12) goes high and the RnIF negative control signal (e.g., 1228 shown in FIG. 12) goes low, which amplifies the differential signal between 1105-1 (D) and D_ 1105-2, resulting in a voltage (e.g., $V_{DD}$) corresponding to a logic 1 or a voltage (e.g., GND) corresponding to a logic 0 being on data line 1105-1 (D) (and the voltage corresponding to the other logic state being on complementary data line 1105-2 (D_)). The sensed data value is stored in the primary latch of sense amplifier 1106. The primary energy consumption occurs in charging the data lines (e.g., 1105-1 (D) or 1105-2 (D_)) from the equilibration voltage $V_{DD}/2$ to the rail voltage $V_{DD}$.

The four sets of possible sense amplifier and accumulator signals illustrated in FIG. 13 (e.g., one for each combination of Row X and Row Y data values) shows the behavior of signals on data lines D and D_. The Row X data value is stored in the primary latch of the sense amp. It should be noted that FIG. 11 shows that the memory cell including storage element 1102-2, corresponding to Row X, is coupled to the complementary data line D_, while the memory cell including storage element 1102-1, corresponding to Row Y, is coupled to data line D. However, as can be seen in FIG. 11, the charge stored in memory cell 1102-2 (corresponding to Row X) corresponding to a "0" data value causes the voltage on data line D_ (to which memory cell 1102-2 is coupled) to go high and the charge stored in memory cell 1102-2 corresponding to a "1" data value causes the voltage on data line D_ to go low, which is opposite correspondence between data states and charge stored in memory cell 1102-2, corresponding to Row Y, that is coupled to data line D. These differences in storing charge in memory cells coupled to different data lines is appropriately accounted for when writing data values to the respective memory cells.

After firing the sense amplifiers, in the pseudo code above, "Activate LOAD" indicates that the LOAD control signal goes high as shown at $t_4$ in FIG. 13, causing load/pass transistors 1118-1 and 1118-2 to conduct. In this manner, activating the LOAD control signal enables the secondary latch in the accumulator of the compute component 1131. The sensed data value stored in the sense amplifier 1106 is transferred (e.g., copied) to the secondary latch. As shown for each of the four sets of possible sense amplifier and accumulator signals illustrated in FIG. 13, the behavior at inputs of the secondary latch of the accumulator indicates the secondary latch is loaded with the Row X data value. As shown in FIG. 13, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 1105-1 (D) and 1105-2 (D_), in the pseudo code above, "Deactivate LOAD" indicates that the LOAD control signal goes back low as shown at $t_5$ in FIG. 13 to cause the load/pass transistors 1118-1 and 1118-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Disable Row X" and indicated at $t_6$ in FIG. 13, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 13 by the EQ signal going high at $t_7$. As shown in each of the four sets of possible sense amplifier and accumulator signals illustrated in FIG. 13 at $t_7$, the equilibrate operation causes the voltage on data lines D and D_ to each return to $V_{DD}/2$.

Equilibration can occur, for instance, prior to a memory cell sensing operation or the logical operations (described below).

A subsequent operation phase associated with performing the AND or the OR operation on the first data value (now stored in the sense amplifier 1106 and the secondary latch of the compute component 1131) and the second data value (stored in a memory cell 1102-1 coupled to Row Y 1104-Y) includes performing particular steps which depend on the whether an AND or an OR is to be performed. Examples of pseudo code associated with "ANDing" and "ORing" the data value residing in the accumulator (e.g., the first data value stored in the memory cell 1102-2 coupled to Row X 1104-X) and the second data value (e.g., the data value stored in the memory cell 1102-1 coupled to Row Y 1104-Y) are summarized below. Example pseudo code associated with "ANDing" the data values can include:

---

Deactivate EQ
Enable Row Y
Fire Sense amplifiers (after which Row Y data resides in the sense amplifiers)
Disable Row Y
   The result of the logic operation, in the next operation, will be placed on the sense amp, which will overwrite any row that is active.
   Even when Row Y is closed, the sense amplifier still contains the Row Y data value.
Activate AND
   This results in the sense amplifier being written to the value of the function (e.g., Row X AND Row Y)
   If the accumulator contains a "0" (i.e., a voltage corresponding to a "0" on node S2 and a voltage corresponding to a "1" on node S1), the sense amplifier data is written to a "0"
   If the accumulator contains a "1" (i.e., a voltage corresponding to a "1" on node S2 and a voltage corresponding to a "0" on node S1), the sense amplifier data remains unchanged (Row Y data)
   This operation leaves the data in the accumulator unchanged.
Deactivate AND
Precharge

---

In the pseudo code above, "Deactivate EQ" indicates that an equilibration signal corresponding to the sense amplifier 1106 is disabled (e.g., such that the complementary data lines 1105-1 (D) and 1105-2 (D_) are no longer shorted to $V_{DD}/2$), which is illustrated in FIG. 13 at $t_8$. After equilibration is disabled, a selected row (e.g., ROW Y) is enabled as indicated in the pseudo code above by "Enable Row Y" and shown in FIG. 13 at $t_9$. When the voltage signal applied to ROW Y reaches the threshold voltage (Vt) of the access transistor (e.g., 1102-1) corresponding to the selected cell, the access transistor turns on and couples the data line (e.g., D_ 1105-1) to the selected cell (e.g., to capacitor 1103-1) which creates a differential voltage signal between the data lines.

After Row Y is enabled, in the pseudo code above, "Fire Sense amplifiers" indicates that the sense amplifier 1106 is enabled to amplify the differential signal between 1105-1 (D) and 1105-2 (D_), resulting in a voltage (e.g., $V_{DD}$) corresponding to a logic 1 or a voltage (e.g., GND) corresponding to a logic 0 being on data line 1105-1 (D) (and the voltage corresponding to the other logic state being on complementary data line 1105-2 (D_)). As shown at $t_{10}$ in FIG. 13, the ACT positive control signal (e.g., 1290 shown in FIG. 12) goes high and the RnIF negative control signal (e.g., 1228 shown in FIG. 12) goes low to fire the sense amplifiers. The sensed data value from memory cell 1102-1 is stored in the primary latch of sense amplifier 1106, as previously described. The secondary latch still corresponds to the data value from memory cell 1102-2 since the dynamic latch is unchanged.

After the second data value sensed from the memory cell 1102-1 coupled to Row Y is stored in the primary latch of sense amplifier 1106, in the pseudo code above, "Disable Row Y" indicates that the selected row (e.g., ROW Y) can be disabled if it is not desired to store the result of the AND logical operation back in the memory cell corresponding to Row Y. However, FIG. 13 shows that Row Y is left enabled such that the result of the logical operation can be stored back in the memory cell corresponding to Row Y. Isolating the memory cell corresponding to Row Y can be accomplished by the access transistor turning off to decouple the selected cell 1102-1 from the data line 1105-1 (D). After the selected Row Y is configured (e.g., to isolate the memory cell or not isolate the memory cell), "Activate AND" in the pseudo code above indicates that the AND control signal goes high as shown in FIG. 13 at $t_{11}$, causing pass transistor 1107-1 to conduct. In this manner, activating the AND control signal causes the value of the function (e.g., Row X AND Row Y) to be written to the sense amp.

With the first data value (e.g., Row X) stored in the dynamic latch of the accumulator 1131 and the second data value (e.g., Row Y) stored in the sense amplifier 1106, if the dynamic latch of the compute component 1131 contains a "0" (i.e., a voltage corresponding to a "0" on node S2 and a voltage corresponding to a "1" on node S1), the sense amplifier data is written to a "0" (regardless of the data value previously stored in the sense amplifier) since the voltage corresponding to a "1" on node S1 causes transistor 1109-1 to conduct thereby coupling the sense amplifier 1106 to ground through transistor 1109-1, pass transistor 1107-1 and data line 1105-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 1106. This operation leaves the data value in the accumulator unchanged (e.g., from Row X).

If the secondary latch of the accumulator contains a "1" (e.g., from Row X), then the result of the AND operation depends on the data value stored in the sense amplifier 1106 (e.g., from Row Y). The result of the AND operation should be a "1" if the data value stored in the sense amplifier 1106 (e.g., from Row Y) is also a "1," but the result of the AND operation should be a "0" if the data value stored in the sense amplifier 1106 (e.g., from Row Y) is also a "0." The sensing circuitry 1150 is configured such that if the dynamic latch of the accumulator contains a "1" (i.e., a voltage corresponding to a "1" on node S2 and a voltage corresponding to a "0" on node S1), transistor 1109-1 does not conduct, the sense amplifier is not coupled to ground (as described above), and the data value previously stored in the sense amplifier 1106 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 1106, "Deactivate AND" in the pseudo code above indicates that the AND control signal goes low as shown at $t_{12}$ in FIG. 13, causing pass transistor 1107-1 to stop conducting to isolate the sense amplifier 1106 (and data line 1105-1 (D)) from ground. If not previously done, Row Y can be closed (as shown at $t_{13}$ in FIG. 13) and the sense amplifier can be disabled (as shown at $t_{14}$ in FIG. 13 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 13).

FIG. 13 shows, in the alternative, the behavior of voltage signals on the data lines (e.g., 1105-1 (D) and 1105-2 (D_) shown in FIG. 11) coupled to the sense amplifier (e.g., 1106 shown in FIG. 11) and the behavior of voltage signals on nodes S1 and S1 of the secondary latch of the compute component (e.g., 1131 shown in FIG. 11) for an AND logical operation involving each of the possible combination of operands (e.g., Row X/Row Y data values 00, 10, 01, and 11).

Although the timing diagrams illustrated in FIG. 13 and the pseudo code described above indicate initiating the AND logical operation after starting to load the second operand (e.g., Row Y data value) into the sense amplifier, the circuit shown in FIG. 11 can be successfully operated by initiating the AND logical operation before starting to load the second operand (e.g., Row Y data value) into the sense amplifier.

Figure 14:
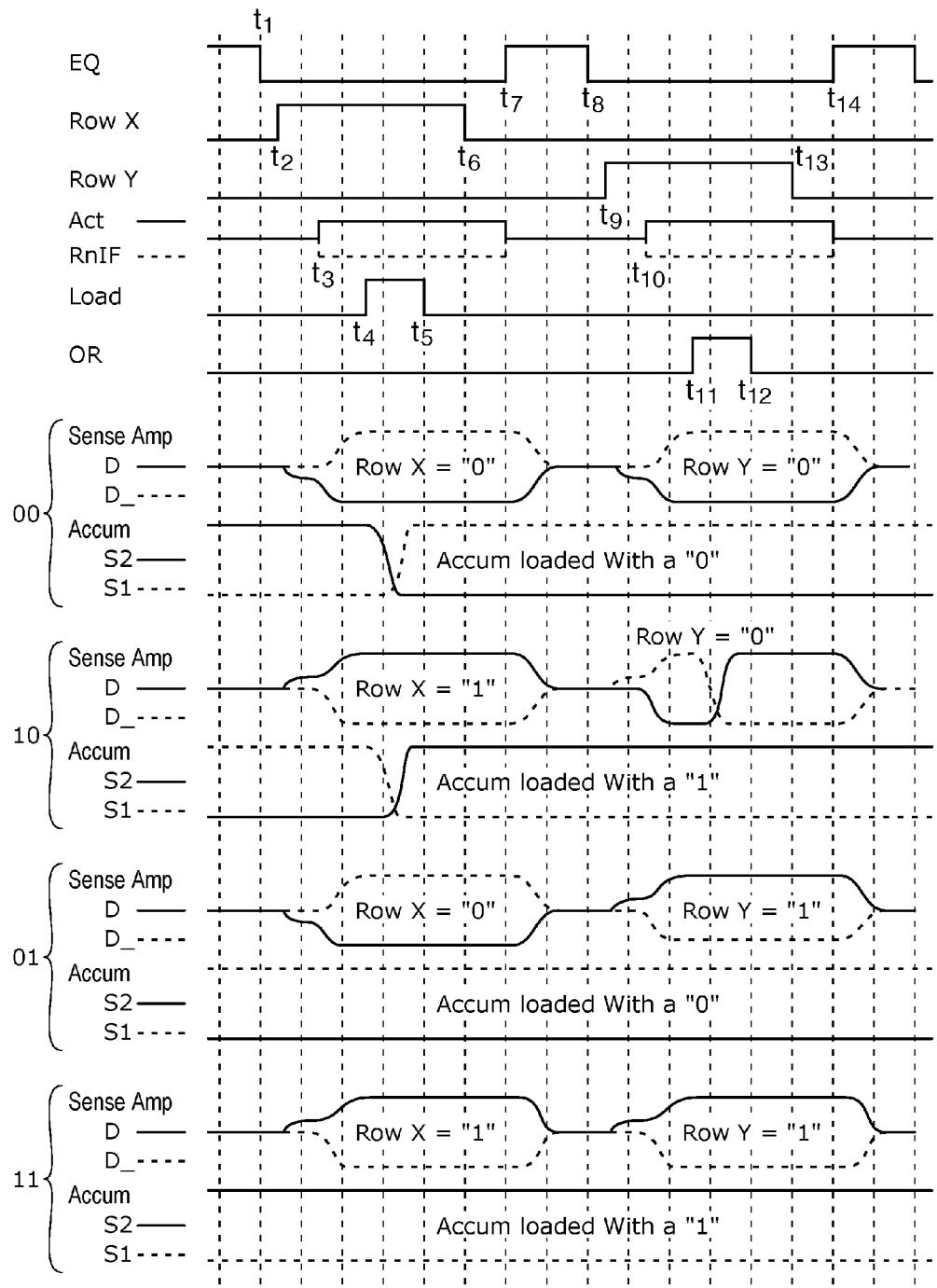
FIG. 14 illustrates a timing diagram associated with performing a number of logical operations using sensing circuitry in accordance with a number of embodiments of the present disclosure.

FIG. 14 illustrates a timing diagram associated with performing a number of logical operations using sensing circuitry in accordance with a number of embodiments of the present disclosure. FIG. 14 illustrates a timing diagram associated with initiating an OR logical operation after starting to load the second operand (e.g., Row Y data value) into the sense amplifier. FIG. 14 illustrates the sense amplifier and accumulator signals for various combinations of first and second operand data values. The particular timing diagram signals are discussed below with respect to the pseudo code associated with an AND logical operation of the circuit shown in FIG. 11.

A subsequent operation phase can alternately be associated with performing the OR operation on the first data value (now stored in the sense amplifier 1106 and the secondary latch of the compute component 1131) and the second data value (stored in a memory cell 1102-1 coupled to Row Y 1104-Y). The operations to load the Row X data into the sense amplifier and accumulator that were previously described with respect to times $t_1$-$t_7$ shown in FIG. 13 are not repeated with respect to FIG. 14. Example pseudo code associated with "ORing" the data values can include:

Deactivate EQ
Enable Row Y
Fire Sense amplifiers (after which Row Y data resides in the sense amplifiers)
Disable Row Y
   When Row Y is closed, the sense amplifier still contains the Row Y data value.
Activate OR
   This results in the sense amplifier being written to the value of the function (e.g., Row X OR Row Y), which may overwrite the data value from Row Y previously stored in the sense amplifier as follows:
   If the accumulator contains a "0" (i.e., a voltage corresponding to a "0" on node S2 and a voltage corresponding to a "1" on node S1), the sense amplifier data remains unchanged (Row Y data)
   If the accumulator contains a "1" (i.e., a voltage corresponding to a "1" on node S2 and a voltage corresponding to a "0" on node S1), the sense amplifier data is written to a "1"
   This operation leaves the data in the accumulator unchanged.
Deactivate OR
Precharge The "Deactivate EQ" (shown at $t_8$ in FIG. 14), "Enable Row Y" (shown at $t_9$ in FIG. 14), "Fire Sense amplifiers" (shown at $t_{10}$ in FIG. 14), and "Disable Row Y" (shown at $t_{13}$ in FIG. 14, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 14, which causes pass transistor 1107-2 to conduct. In this manner, activating the OR control signal causes the value of the function (e.g., Row X OR Row Y) to be written to the sense amp.

With the first data value (e.g., Row X) stored in the secondary latch of the compute component 1131 and the second data value (e.g., Row Y) stored in the sense amplifier 1106, if the dynamic latch of the accumulator contains a "0" (i.e., a voltage corresponding to a "0" on node S2 and a voltage corresponding to a "1" on node S1), then the result of the OR operation depends on the data value stored in the sense amplifier 1106 (e.g., from Row Y). The result of the OR operation should be a "1" if the data value stored in the sense amplifier 1106 (e.g., from Row Y) is a "1," but the result of the OR operation should be a "0" if the data value stored in the sense amplifier 1106 (e.g., from Row Y) is also a "0." The sensing circuitry 1150 is configured such that if the dynamic latch of the accumulator contains a "0," with the voltage corresponding to a "0" on node S2, transistor 1109-2 is off and does not conduct (and pass transistor 1107-1 is also off since the AND control signal is not asserted) so the sense amplifier 1106 is not coupled to ground (either side), and the data value previously stored in the sense amplifier 1106 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 1109-2 does conduct (as does pass transistor 1107-2 since the OR control signal is asserted), and the sense amplifier 1106 input coupled to data line 1105-2 (D_) is coupled to ground since the voltage corresponding to a "1" on node S2 causes transistor 1109-2 to conduct along with pass transistor 1107-2 (which also conducts since the OR control signal is asserted). In this manner, a "1" is initially stored in the sense amplifier 1106 as a result of the OR operation when the secondary latch of the accumulator contains a "1" regardless of the data value previously stored in the sense amp. This operation leaves the data in the accumulator unchanged. FIG. 14 shows, in the alternative, the behavior of voltage signals on the data lines (e.g., 1105-1 (D) and 1105-2 (D_) shown in FIG. 11) coupled to the sense amplifier (e.g., 1106 shown in FIG. 11) and the behavior of voltage signals on nodes S1 and S2 of the secondary latch of the compute component 1131 for an OR logical operation involving each of the possible combination of operands (e.g., Row X/Row Y data values 00, 10, 01, and 11).

After the result of the OR operation is initially stored in the sense amplifier 1106, "Deactivate OR" in the pseudo code above indicates that the OR control signal goes low as shown at $t_{12}$ in FIG. 14, causing pass transistor 1107-2 to stop conducting to isolate the sense amplifier 1106 (and data line D 1105-2) from ground. If not previously done, Row Y can be closed (as shown at $t_{13}$ in FIG. 14) and the sense amplifier can be disabled (as shown at $t_{14}$ in FIG. 14 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 14.

The sensing circuitry 1150 illustrated in FIG. 11 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 1114-1 to conduct and activating the ANDinv control signal causes transistor 1114-2 to conduct. In each case, asserting the appropriate inverted control signal can flip the sense amplifier and cause the result initially stored in the sense amplifier 1106 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 11 can perform a NOT (e.g., invert) operation by putting the non-inverted data value into the dynamic latch of the accumulator and using that data to invert the data value in the sense amplifier 1106. As previously mentioned, activating the ORinv control signal causes transistor 1114-1 to conduct and activating the ANDinv control signal causes transistor 1114-2 to conduct. The ORinv and/or ANDinv control signals are used in implementing the NOT function, as described further below:

---

Copy Row X into the Accumulator
  Deactivate EQ
  Enable Row X
  Fire Sense amplifiers (after which Row X data resides in the sense amplifiers)
  Activate LOAD (sense amplifier data (Row X) is transferred to nodes S1 and S2 of the Accumulator and resides there dynamically
  Deactivate LOAD
  Activate ANDinv and ORinv (which puts the compliment data value on the data lines)
    This results in the data value in the sense amplifier being inverted (e.g., the sense amplifier latch is flipped)
    This operation leaves the data in the accumulator unchanged
  Deactivate ANDinv and ORinv
  Disable Row X
  Precharge

---

The "Deactivate EQ," "Enable Row X," "Fire Sense amplifiers," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and precharging after the Row X data is loaded into the sense amplifier 1106 and copied into the dynamic latch, a compliment version of the data value in the dynamic latch of the accumulator can be placed on the data line and thus transferred to the sense amplifier 1106 by enabling (e.g., causing transistor to conduct) and disabling the invert transistors (e.g., ANDinv and ORinv). This results in the sense amplifier 1106 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 1150 shown in FIG. 11 initially stores the result of the AND, OR, and NOT logical operations in the sense amplifier 1106 (e.g., on the sense amplifier nodes), these logical operation results can be communicated easily and quickly to any enabled row, any row activated after the logical operation is complete, and/or into the secondary latch of the compute component 1131. The sense amplifier 1106 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 1106 fires.

When performing logical operations in this manner, the sense amplifier 1106 can be pre-seeded with a data value from the dynamic latch of the accumulator to reduce overall current utilized because the sense amplifiers 1106 are not at full rail voltages (e.g., supply voltage or ground/reference voltage) when accumulator function is copied to the sense amplifier 1106. An operation sequence with a pre-seeded sense amplifier 1106 either forces one of the data lines to the reference voltage (leaving the complementary data line at $V_{DD}/2$, or leaves the complementary data lines unchanged. The sense amplifier 1106 pulls the respective data lines to full rails when the sense amplifier 1106 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 1123 can be used for shifting data values stored in memory cells coupled to a particular pair of complementary data lines to the sensing circuitry 1150 (e.g., sense amplifier 1106) corresponding to a different pair of complementary data lines (e.g., such as a sense amplifier 1106 corresponding to a left or right adjacent pair of complementary data lines. As used herein, a sense amplifier 1106 corresponds to the pair of complementary data lines to which the sense amplifier is coupled when isolation transistors 1121-1 and 1121-2 are conducting. The SHIFT operations (right or left) do not pre-copy the Row X data value into the accumulator. Operations to shift right Row X can be summarized as follows:

---

Deactivate Norm and Activate Shift
Deactivate EQ
Enable Row X
Fire Sense amplifiers (after which shifted Row X data resides in the sense amplifiers)
Activate Norm and Deactivate Shift
Disable Row X
Precharge In the pseudo code above, "Deactivate Norm and Activate Shift" indicates that a NORM control signal goes low causing isolation transistors 1121-1 and 1121-2 of the shift circuitry 1123 to not conduct (e.g., isolate the sense amplifier from the corresponding pair of complementary data lines). The SHIFT control signal goes high causing isolation transistors 1121-3 and 1121-4 to conduct, thereby coupling the sense amplifier 1106 to the left adjacent pair of complementary data lines (e.g., on the memory array side of non-conducting isolation transistors 1121-1 and 1121-2 for the left adjacent pair of complementary data lines).

After the shift circuitry 1123 is configured, the "Deactivate EQ," "Enable Row X," and "Fire Sense amplifiers" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 1106.

In the pseudo code above, "Activate Norm and Deactivate Shift" indicates that a NORM control signal goes high causing isolation transistors 1121-1 and 1121-2 of the shift circuitry 1123 to conduct (e.g., coupling the sense amplifier to the corresponding pair of complementary data lines), and the SHIFT control signal goes low causing isolation transistors 1121-3 and 1121-4 to not conduct and isolating the sense amplifier 1106 from the left adjacent pair of complementary data lines (e.g., on the memory array side of non-conducting isolation transistors 1121-1 and 1121-2 for the left adjacent pair of complementary data lines). Since Row X is still active, the Row X data value that has been shifted right is transferred to Row X of the corresponding pair of complementary data lines through isolation transistors 1121-1 and 1121-2.

After the Row X data values are shifted right to the corresponding pair of complementary data lines, the selected row (e.g., ROW X) is disabled as indicated by "Disable Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

---

Operations to shift left Row X can be summarized as follows:
Activate Norm and Deactivate Shift
Deactivate EQ
Enable Row X
Fire Sense amplifiers (after which Row X data resides in the sense amplifiers)
Deactivate Norm and Activate Shift
  Sense amplifier data (shifted left Row X) is transferred to Row X
Disable Row X
Precharge

---

In the pseudo code above, "Activate Norm and Deactivate Shift" indicates that a NORM control signal goes high causing isolation transistors 1121-1 and 1121-2 of the shift circuitry 1123 to conduct, and the SHIFT control signal goes low causing isolation transistors 1121-3 and 1121-4 to not conduct. This configuration couples the sense amplifier 1106 to a corresponding pair of complementary data lines and isolates the sense amplifier from the right adjacent pair of complementary data lines.

After the shift circuitry is configured, the "Deactivate EQ," "Enable Row X," and "Fire Sense amplifiers" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 1150 is stored in the sense amplifier 1106.

In the pseudo code above, "Deactivate Norm and Activate Shift" indicates that a NORM control signal goes low causing isolation transistors 1121-1 and 1121-2 of the shift circuitry 1123 to not conduct (e.g., isolate the sense amplifier from the corresponding pair of complementary data lines), and the SHIFT control signal goes high causing isolation transistors 1121-3 and 1121-4 to conduct coupling the sense amplifier to the left adjacent pair of complementary data lines (e.g., on the memory array side of non-conducting isolation transistors 1121-1 and 1121-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Disable Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDS or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

While example embodiments including various combinations and configurations of sensing circuitry, sense amplifiers, compute circuit, dynamic latches, and/or shift circuitry have been illustrated and described herein, embodiments of the present disclosure are not limited to those combinations explicitly recited herein. Other combinations and configurations of the sensing circuitry, sense amplifiers, compute circuit, dynamic latches, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    transferring a data value stored on a first pair of complementary sense lines, without pre-copying the data value to a first compute component latch coupled to the first pair of complementary sense lines, to a second compute component latch coupled to the second pair of complementary sense lines via enabling of a pair of shift transistors coupled between the first pair of complementary sense lines and the second compute latch, wherein:
        the first pair of complementary sense lines correspond to a first column of memory cells;
        the second pair of complementary sense lines correspond to a second column of memory cells adjacent to the first column of memory cells;
        the first and second compute component latches each comprise:
            a first pass transistor, a second pass transistor, a third pass transistor, and a fourth pass transistor; and
            a secondary latch selectively coupled to the first or second pair of sense lines via the first and second pass transistors;
        a first source/drain of the third pass transistor is directly coupled to a first source/drain of the first pass transistor, a first source/drain of the fourth pass transistor is directly coupled to a first source drain of the second pass transistor, a second source/drain of the third pass transistor is directly coupled to a second source/drain of the second pass transistor, and a second source/drain of the fourth pass transistor is directly coupled to a second source/drain of the first pass transistor;
        the first source/drain region of the third pass transistor is directly coupled to a first one of the first or second pair of complementary sense lines;
        the first source/drain region of the second pass transistor is directly coupled to a second one of the first or second pair of complementary sense lines;
        the second source/drain region of the first pass transistor is directly coupled to a first input of the secondary latch;
        the second source/drain region of the second pass transistor directly coupled to a second input of the secondary latch; and
        the first pass transistor and the second pass transistor are enabled via different control signals; and
    storing the data value from the second compute component latch to the second sense amplifier.

2. The method of claim 1, wherein the method comprises, prior to transferring the data value, performing a sensing operation on a memory cell of the first column of memory cells to store the data value in a first sense amplifier coupled to the first pair of complementary sense lines.

3. The method of claim 1, wherein transferring the data value comprises enabling a pair of pass transistors coupled between respective input nodes of the first compute component latch and the first pair of complementary sense lines.

4. The method of claim 1, wherein transferring the data value comprises activating a shift control signal coupled to respective gates of the pair of shift transistors.

5. The method of claim 1, further comprising, prior to storing the data value, performing an equilibrate operation.

6. The method of claim 5, further comprising, subsequent to performing the equilibrate operation, enabling a pair of pass transistors coupled between respective input nodes of the second compute component latch and the first pair of complementary sense lines.

7. The method of claim 5, further comprising:
    while the pair of pass transistors are enabled, enabling the second sense amplifier; and
    subsequent to enabling the second sense amplifier, disabling the pair of pass transistors.

8. The method of claim 1, wherein the pair of shift transistors comprise a first shift transistor and a second shift transistor, and wherein a first source/drain of the first shift transistor is directly coupled to a first sense line of the first pair of complementary sense lines, and wherein a second source/drain of the first shift transistor is directly coupled to a first input node of the second compute component latch.

9. The method of claim 1, wherein the pair of shift transistors are of a same type and are coupled to a same shift control signal.

10. The method of claim 5, further comprising maintaining the first compute component latch in a continuously enabled state while transferring the data value.

11. A method, comprising:
    loading a data value from a first sense amplifier coupled to a first pair of complementary sense lines corresponding to a first column of memory cells into a compute component latch coupled to the first pair of complementary sense lines and corresponding to the first column of memory cells;

isolating the compute component latch from the first pair of complementary sense lines via a pair of pass transistors; and enabling a pair of shift transistors to shift, via a second pair of complementary sense lines adjacent to the first pair of complementary sense lines, the data value from the compute component latch to a second sense amplifier coupled to the second pair of complementary sense lines, wherein:
- the second pair of complementary sense lines correspond to a second column of memory cells adjacent to the first column of memory cells;
- the pair of shift transistors comprise a first shift transistor and a second shift transistor;
- a first source/drain of the first shift transistor is directly coupled to an input node of the second sense amplifier;
- a second source/drain of the first shift transistor is directly coupled to a first input node of the compute component latch;
- the pair of pass transistors comprise a first shift transistor and a second shift transistor;
- a first source/drain of the first pass transistor is directly coupled to the first input node of the compute component latch and the second source/drain region of the first shift transistor;
- a second source/drain of the first pass transistor is directly coupled to a first sense line of the first pair of complementary sense lines;
- a first source/drain of the second pass transistor is directly coupled to a second input node of the compute component latch and to a source/drain region of the second shift transistor; and
- a second source/drain of the second pass transistor is directly coupled to a second sense line of the first pair of complementary sense lines.

12. The method of claim 11, further comprising:
while the pair of shift transistors are enabled, enabling the second sense amplifier; and
disabling the pair of shift transistors to isolate the second pair of complementary sense lines from the compute component latch.

13. The method of claim 11, wherein loading the data value comprises enabling the pair of pass transistors.

14. The method of claim 13, further comprising, subsequent to loading the data value:
disabling the pair of pass transistors; and
performing an equilibrate operation prior to enabling the pair of shift transistors.

15. The method of claim 11, wherein the compute component latch is a continuously enabled latch.

16. The method of claim 11, wherein isolating the compute component latch comprises applying different control signals to the respective transistors of the pair of pass transistors.

17. A method, comprising:
sensing, via a first sense amplifier comprising a primary latch coupled to a first pair of complementary sense lines corresponding to a first column of memory cells, a data value stored in a memory cell of the first column of memory cells; and
transferring the data value to at least one of:
- a compute component latch comprising a secondary latch selectively coupled to a second pair of complementary sense lines adjacent to the first pair of complementary sense lines via a pair of pass transistors via enabling a first pair of shift transistors coupled to the first pair of complementary sense lines; and
- a compute component latch comprising a secondary latch selectively coupled to the first pair of sense lines via a pair of pass transistors and corresponding to the first column of memory cells, and then subsequently to a second sense amplifier coupled to a third pair of complementary sense lines adjacent to the first pair of complementary sense lines via enabling a second pair of shift transistors coupled to the third pair of complementary sense lines, wherein:
- the second pair of complementary sense lines correspond to a second column of memory cells adjacent to the first column of memory cells;
- the third pair of complementary sense lines correspond to a third column of memory cells adjacent to the first column of memory cells; and
- the compute components each comprise:
  - a first source/drain region of a first pass transistor directly coupled to a first one of the first or second pair of complementary sense lines;
  - a first source/drain region of a second pass transistor directly coupled to a second one of the first or second pair of complementary sense lines;
  - a second source/drain region of the first pass transistor directly coupled to a first input of the secondary latch;
  - a second source/drain region of the second pass transistor directly coupled to a second input of the secondary latch; and
  - the first pass transistor and the second pass transistor are enabled via different control signals.

18. The method of claim 17, wherein the compute component latch coupled to the first pair of sense lines is part of a first compute component also comprising a pair of pass transistors, wherein a first pass transistor of the pair is directly coupled to one of the first pair of shift transistors, and wherein a second pass transistor of the pair is directly coupled to one of the second pair of shift transistors.

19. The method of claim 17, wherein the method further comprises storing the data value in at least one of:
a memory cell of the second column of memory cells; and
a memory cell of the third column of memory cells.

* * * * *